United States Patent
Sarmiento

(10) Patent No.: US 10,947,992 B2
(45) Date of Patent: Mar. 16, 2021

(54) CONVECTORS

(71) Applicant: Pedro Arnulfo Sarmiento, San Diego, CA (US)

(72) Inventor: Pedro Arnulfo Sarmiento, San Diego, CA (US)

(*) Notice: Subject to any disclaimer, the term of this patent is extended or adjusted under 35 U.S.C. 154(b) by 523 days.

(21) Appl. No.: 15/238,678

(22) Filed: Aug. 16, 2016

(65) Prior Publication Data
US 2017/0051757 A1    Feb. 23, 2017

Related U.S. Application Data

(60) Provisional application No. 62/205,883, filed on Aug. 17, 2015.

(51) Int. Cl.
  *F04D 29/58* (2006.01)
  *F04D 29/42* (2006.01)
  (Continued)

(52) U.S. Cl.
  CPC ............ *F04D 29/58* (2013.01); *F04D 5/001* (2013.01); *F04D 23/00* (2013.01); *F04D 29/24* (2013.01);
  (Continued)

(58) Field of Classification Search
  CPC .... F04D 17/161; F04D 17/165; F04D 17/122; F04D 29/043; F04D 5/001; F28D 11/00;
  (Continued)

(56) References Cited

U.S. PATENT DOCUMENTS

| 3,018 A | 6/1868 | Tyler |
|---|---|---|
| 90,000 A | 5/1869 | Hubble |

(Continued)

FOREIGN PATENT DOCUMENTS

| FR | 2292882 | | 6/1976 | |
|---|---|---|---|---|
| FR | 2292882 A1 | * | 6/1976 | ........... F04D 17/161 |
| WO | WO-2014156070 A1 | * | 10/2014 | ............. F04D 25/02 |

OTHER PUBLICATIONS

No Author, Thermal Conductivity of Metals and Alloys, Nov. 5, 2013, Neutrium, https://neutrium.net/heat_transfer/thermal-conductivity-of-metals-and-alloys/, 2 pages (Year: 2013).*

(Continued)

*Primary Examiner* — Joel M Attey
*Assistant Examiner* — For K Ling
(74) *Attorney, Agent, or Firm* — Cowan, Liebowitz & Latman, P.C.; Mark Montague; Brian S. Matross

(57) ABSTRACT

A convector includes a stator made up of an array of fixed, parallel, equally spaced, equally thick, thermally conductive plates attached to a relatively thick thermally conductive plate. Convectors are provided with a rotor that is made up of an array of flat, rotatable, parallel, equally spaced, equally thick discs. The discs of the rotor are placed between the plates of the stator at relatively close proximity from the walls of the stator plates. Furthermore, the discs are keyed or held in place with the help of spacers and compression nuts to a hollow or a solid shaft. A clearance aperture, circular in shape, is provided on the stator plates. The shaft is held in place at both ends by roller bearings that provide the means for the shaft to rotate. To impart rotational motion to the rotor, the shaft is attached to an external device such as a motor.

6 Claims, 33 Drawing Sheets

(51) Int. Cl.
 *F04D 29/24* (2006.01)
 *H01L 23/467* (2006.01)
 *F04D 23/00* (2006.01)
 *F28F 5/00* (2006.01)
 *F04D 5/00* (2006.01)
 *H01L 23/473* (2006.01)

(52) U.S. Cl.
 CPC ............... *F04D 29/42* (2013.01); *F28F 5/00* (2013.01); *H01L 23/467* (2013.01); *F05B 2240/12* (2013.01); *F05B 2240/14* (2013.01); *F05B 2240/20* (2013.01); *F05B 2240/61* (2013.01); *F05B 2260/20* (2013.01); *F28F 2250/08* (2013.01); *H01L 23/473* (2013.01); *Y02T 50/60* (2013.01)

(58) Field of Classification Search
 CPC ........ F28D 11/02; F28D 15/0266; F28F 5/02; F05B 2240/61; H01L 23/467
 USPC ............... 165/8, 86, 89, 92, 80.3, 121, 122; 361/690, 709, 710, 694
 See application file for complete search history.

(56) References Cited

U.S. PATENT DOCUMENTS

| | | | |
|---|---|---|---|
| 148,951 A | 3/1874 | Hawkins | |
| 157,453 A | 12/1874 | Kinney et al. | |
| 182,833 A | 10/1876 | Klinginsmith | |
| 1,047,898 A | 12/1912 | Scott | |
| 1,056,338 A | 3/1913 | Johnsen | |
| 1,061,142 A | 5/1913 | Tesla | |
| 1,061,206 A | 5/1913 | Tesla | |
| 1,689,189 A * | 10/1928 | Broadhurst | F28D 11/02 165/92 |
| 2,632,598 A * | 3/1953 | Wales, Jr. | F04D 17/161 416/4 |
| 3,597,117 A * | 8/1971 | Zoehfeld | F04D 17/16 417/354 |
| 3,844,341 A | 10/1974 | Bimshas, Jr. et al. | |
| 3,989,101 A | 11/1976 | Manfredi | |
| 4,271,682 A * | 6/1981 | Seki | F28D 11/02 62/354 |
| 4,279,295 A * | 7/1981 | Duckworth | A23G 1/18 165/94 |
| 4,669,277 A * | 6/1987 | Goldstein | F28F 19/008 62/354 |
| 5,297,926 A * | 3/1994 | Negishi | F04D 5/001 415/198.1 |
| 5,335,143 A | 8/1994 | Maling, Jr. et al. | |
| 5,778,971 A * | 7/1998 | Szam | F16C 13/00 137/340 |
| 5,794,687 A * | 8/1998 | Webster, Jr. | H01L 23/467 165/121 |
| 5,794,697 A | 8/1998 | Webster, Jr. et al. | |
| 6,050,326 A | 4/2000 | Evans et al. | |
| 7,241,106 B2 | 7/2007 | Avina | |
| 7,569,089 B2 * | 8/2009 | Avina | B01D 53/0415 416/93 R |
| 8,228,675 B2 | 7/2012 | Koplow | |
| 8,678,075 B2 * | 3/2014 | Wang | F28D 15/0275 165/104.26 |
| 8,951,012 B1 * | 2/2015 | Santoro | F04D 19/024 416/124 |
| 8,988,881 B2 | 3/2015 | Koplow | |
| 9,409,264 B2 | 8/2016 | Gilliland et al. | |
| 2003/0086782 A1 * | 5/2003 | Moorehead | F01D 1/36 415/1 |
| 2005/0191178 A1 * | 9/2005 | Watkins | F04D 29/20 415/216.1 |
| 2006/0051206 A1 * | 3/2006 | Lyons | F04D 29/422 415/206 |
| 2007/0280825 A1 * | 12/2007 | Chen | F04D 1/063 415/199.4 |
| 2012/0227940 A1 | 9/2012 | Thomas | |
| 2013/0327505 A1 | 12/2013 | Gonzalez et al. | |

OTHER PUBLICATIONS

John D. Anderson JR., Ludwig Prandtl's Boundary Layer, Physics Today, pp. 42-48 Dec. 2005.
University of California—Alec B. Eason, M.A., Flow and Measurement of Air and Gases., Charles Griffin and Company, Limited, dated 1919, pp. 1-304.
National Advisory Committee for Aeronautics, Technical Memoranum No. 1092, TH. Von Karman, on Laminar and Turbulent Friction, vol. 1, No. 4, Aug. 1921, pp. 1-40.
National Advisory Committee for Aeronautics, Technical Memoranum No. 1256, H. Blasius, The Boundary Layers in Fluids With Little Friction, 1908, pp. 1-58.

* cited by examiner

PRIOR ART

PRIOR ART

PRIOR ART

PRIOR ART

CONVECTORS

CROSS REFERENCE TO RELATED APPLICATIONS

This application claims the benefit of U.S. Prov. Pat. App. No. 62/205,883 filed on Aug. 17, 2015, the entirety of which is hereby incorporated by reference.

BACKGROUND

Convectors can be described as fluid-propulsing devices were the heat transfer occurs due to the utilization of an array of discs (rotor) interlaced with arrays of static plates (stator). The heat transfer between the static plates and the cooling fluid takes place due to the disruption of the boundary layer by the rotating discs on the static plates and the movement of the fluid in and out of the device occurring due to the resistance or drag that takes place between the discs and the fluid and the walls of the rotating discs that conform the rotor and the walls of the static plates that conform the stator.

PRIOR ART

Bladeless Blowers and Turbines

Bladeless turbines or blowers refer to devices were the fluid scooping mechanism (vanes, buckets, etc.) have been replaced with arrays of flat discs to produce motive forces when utilized in conjunction of water, air or steam. Bladeless turbines were originally invented in Europe were the first patent was granted in 1832, but their development continued on and by the early 1900s, many improvements had been made. Most notably was the device that Nikola Tesla patented as a Fluid Propulsing (device). His U.S. Pat. No. 1,061,142 (Filed on 1909) describes a blower or pump that, driven by a motor as shown in FIG. 1, was capable to move a fluid by using an array of periodically spaced discs keyed to a solid shaft. Tesla's explanation was that the rotating discs dragged the fluid due to "lateral" or "skin resistance." A few years later, Nikola Tesla (U.S. Pat. No. 1,061,206, Filed Jan. 17, 1911), Jonas Albert Johnsen (U.S. Pat. No. 1,056,338, Filed Nov. 1, 1911) and William A. Scott (U.S. Pat. No. 1,047,898, Filed Dec. 17, 1912) patented separately their own versions of bladeless turbines.

Tubular Shafts

Early designs of fan-blowers, such as the ones from Garduer C. Hawkins (U.S. Pat. No. 148,951 Filed on 1874), Kinney et al (U.S. Pat. No. 157,453 Filed 1874) and Albert J. Klinginsmith (U.S. Pat. No. 182,833 Filed 1876), were provided with axial openings for the air to enter the device. In time, new designs like the one proposed by N. B. Wales Jr. (U.S. Pat. No. 2,632,598 Filed on 1950) eliminated the intake openings on the side were the motor was to be located and air was allowed to enter only on the opposite side. Frank A. Manfredi also proposed a tubular shaft in his U.S. Pat. No. 3,989,101 (Filed on 1975), but he used it as a fluid conducting conduit, for heat exchanging purposes. In 2004 David Christopher Aviña filed for a patent for a "Combined Cycle Boundary Layer turbine" for which he obtained U.S. Pat. No. 7,241,106. Aviña describes his device, shown in FIG. 2, as a rotating perforated tubular conduit that allows fluid to flow between the discs.

Flat Discs and Fins

A cylinder, made up of a combination of rotating flat discs and fixed fins behaving as an active heat transfer mechanism was introduced by John Bimshas Jr. et al (all from IBM), in their U.S. Pat. No. 3,844,341 Filed on 1972. Bimshas Jr. et al's patent introduced also a variant that consisted on the use of concentric, vertical, periodic, annular walls rotating between similar, fixed structures, as shown in FIG. 3. The device, according to Bimshas et al, was intended to be placed between a heat source and a heat sink and was "to thermally control a device such as an "intergimbal assembly of inertial guidance structures." Bimshas Jr. et al's devices were intended to behave as thermal bridges since there were no inlets or outlets provided for a moving fluid. In fact, they were designed to be fully enclosed and the gaps between the rotating structures and the fixed walls were to be filled with helium to help reduce the thermal impedance.

By 1993, George C. Maling Jr. and Roger R. Schmidt filed for a patent on a device that they described as a "Disk augmented heat transfer system." U.S. Pat. No. 5,335,143 was granted to them in 1994, and in it, the patent depicts the device as a series of equally spaced, parallel discs, attached to a rotatable shaft, as shown in FIG. 4. The discs were placed between fins of a heat sink, once in motion the discs removed the heat from the fins by the disruption of the thermal boundary layer (on the fins).

Twenty five years later, another group of investigators and scientists working also for IBM, took Bimshas et al's design and modified it. Leo H. Webster Jr. et al filed for a patent in 1997 getting one granted by the middle of 1998 (U.S. Pat. No. 5,794,687). The device was given the self-explanatory name of "Forced Air Cooling Apparatus for Semiconductor Chips" and, unlike Bimshas et al's device, it consisted of several horizontal discs contained within a cylindrical heat sink with intake and exhaust slots located along the perimeter of the cylindrical structure, as shown in FIG. 5.

Thermal Gap

Kinetic cooling consists of a spinning disc or, in some cases, a spinning impeller that hydroplanes over a hot area just 13-25 microns (0.0005-0.0010 inches) away. In a counter-intuitive process, heat transfer in these devices takes place conductively through the minute air gap between the hot surface and the rotating surface of the disc or impeller. The heat, transferred to the disc, is then carried away by the air going over the top surface of the rotating disc or through the vanes of the spinning impeller. Recent patents and patent applications related to this technology include Jeffrey P. Koplow U.S. Pat. No. 8,988,881 (Filed on 2010) and U.S. Pat. No. 8,228,675 (Filed on 2010). In his designs, Koplow has incorporated a spinning, heat sink with swept vanes over a vapor chamber acting as a heat spreader, as shown in FIG. 6. Similarly, Daniel Thomas Pat. App. No. 20120227940 (Filed on 2011) describes a small toroidal fluid mover that hovers above a credit-card size heat spreader that is partially filled with a fluid, as shown in FIG. 7. Finally, Lino A. Gonzalez Pat. App. No. 20130327505 (Filed on 2013) has a device very similar to Koplow's but with improvements to maintain the spatial gap constant, as shown in FIG. 8.

BACKGROUND

The technical background leading to the invention of these novel devices referred as convectors can be explained through the seminal work of W. Odell, Ludwig Prandtl, Heinrich Blasius, Alec E. Beason and Theodore von Kármán along the various technical improvements, devices and methods previously mentioned.

In Jan. 23, 1904 W. Odell published his findings related to air friction in the Electrical Review[1], a UK based, weekly-magazine dedicated to informing the electrical industry about power generation, power distribution, factory automation, renewable energy, building services and power quality. The article, entitled "Preliminary Experiments on Air Friction," presented his findings related to the "loss of power due to friction with the air of large rotating objects . . . " Odell ran a series of experiments with discs of various discs. In his experiments Odell was well aware of the behavior of the air on a rotating disc, describing the effect with the help of a simple sketch he said "Let AB, FIG. 4, be the edge view of a disc of radius rat its centre parallel to CD and delivering it radially at A and B to travel along the path indicated by the arrows, and to return ultimately to the centre again." Utilizing the formula for the loss of energy of a fluid through a pipe, conjuring up the law for centrifugal pumps and manipulating the results from his experiments, Odell arrives to the rate of the loss of energy=$C\omega^2 r^2$ hoping to determine the value of the coefficient C in future experiments. In the same year, on August 1904, Ludwig Prandtl presented at the Third International Mathematical Congress in Heidelberg, Germany, a paper where he introduced the concept of the boundary layer[2]. According to Prandtl, a fluid slows down only in a thin layer next to the surface that is moving over. This thin layer, a boundary layer, starts forming at the beginning of the flow and slowly increases in thickness. It is laminar in the beginning but becomes turbulent after a point determined by the Reynolds number. Since the effect of viscosity is confined to the boundary layer, the fluid away from the boundary may be treated as ideal. The fundamental concept suggested by Prandtl, defines the boundary layer as a thin film of fluid flowing with very high Reynolds Numbers (Re), that is, with relatively low viscosity as compared with inertia forces. Because computation of the boundary layer parameters is based on the solution of equations obtained from the Navier-Stokes equations for viscous fluid motion, the introduction of the concept of a very thin boundary layer provided a considerably simplified solution to these equations. It should be noted that, in spite of its relative thinness, the boundary layer is very important for initiating processes of dynamic interaction between the flow and the body. The boundary layer determines the aerodynamic drag and lift of the flying vehicle, or the energy loss for fluid flow in channels.

Prandtl's work was followed by that of his student Heinrich Blasius, whom in 1908 published in the respected journal Zeitschrift fur Mathematik und Physik, his paper "*Boundary Layers in Fluids with Little Friction,*"[3] discussed 2D boundary-layer flows over a flat plate and a circular cylinder. Blasius went to solve the boundary-layer equations in both cases, providing an even more accurate solution for the skin-friction drag than the one offered in Prandtl's paper.

Over a decade later, on August 1919, an electric engineer, Alec Birks Eason, publishes in London, a book entitled "*Flow and Measurement of Air and Gases.*"[4] The book consisted of a series of chapters that provided information related to air and gas flow. In the book, in a chapter entitled "Friction on discs," Eason discusses the work of W. Odell related to the experiments on the power required to rotate discs in air. In 1904, Odell's article indicated that "for a fixed speed co, but variable diameter d, torque varied as $(d)^{5-6}$" and that "the loss of kinetic energy in friction per unit weight of air depended on the length of the path which the air had to travel." Eason claimed that he could deal with the disc friction in another way. He indicated: "a disc moving at some velocity in still air will experience a retarding force k, where k will depend upon whether the surface has other surfaces near it or not, and will vary with the existence of other surfaces near the rotating disc, so that two discs near together should experience more resistance to motion than the same two discs placed far apart, because each disc sets up its own eddies, and the two sets of eddies resist each other." After defining a formula for force, torque and power he added:

"If a series of discs were placed on a shaft and the whole series were rotated, and if fixed discs were placed between each of the rotating ones, by altering the number of the discs we should get a good measure of the friction and should be able to find the value of k. If this arrangement is air-tight, so that the pressure of the air in which the vanes rotate can be varied, we could get the value of k for various pressures: it should vary nearly as the pressure."

The simplest kind of rotating disk system is the "free disk," an infinite-radius rotating disk in a fluid. This was originally examined by Theodore von Kármán[5], a former student of Prandtl's and a professor at the University of Aachen, whom in 1921, obtained a momentum-integral equation through the simple process of integrating the boundary-layer equations across the boundary layer showing that, the disk drags fluid from the rotor center to the outside edge, at the same time, drawing fresh fluid inward axially. As a result of Kármán's work the boundary layer theory finally began to receive more attention and acceptance in the technical community. Prandt'l boundary-layer idea provided a revolutionary way to conceptualize fluid dynamics and helped remove the confusion related to the role of viscosity in a fluid flow. After Prandtl, the fluid dynamicist could quantitatively calculate the skin-friction drag, that is, the drag due to friction on a surface immersed in a fluid flow.

REFERENCES

1. W. Odell, "Preliminary Experiments on Air Friction" Vol. CLIV No. 4 Electrical Review, New York, Saturday, Jan. 23, 1904
2. John D. Anderson Jr., "Ludwig Prandtl's Boundary Layer", December 2005, Physics Today, pp 42-48
3. P. R. H. Blasius, Z. Math. Phys. 1 (1908)
4. Alec Birks Eason, "Flow and Measurement of Air and Gases", Philadelphia: J. B. Lippincott Company, August 1919. Chapter XII, Air Friction on Moving Surfaces, C—Friction on Discs, pp 224-227
5. T. von Kármán, "Über laminare und turbulente Reibung," Z. Angew. Math. Mech., vol. 1, no. 4, pp. 233-235, 1921.

It is the combination of all of these previous inventions and technological advancements that have been utilized in the design of the novel devices that are being referred here as convectors. It is the primary intention of the inventor to convey the design and procedures to build such devices and to provide to those skilled in the art to get a clear idea of their usefulness and versatility, especially in the various areas that can easily be recognized as potential fields were the devices could provide great improvements. It is also expected that the following detailed description of the invention along with the description of the figures will leave no questions related to the inventor's intentions.

DESCRIPTION OF THE INVENTION

Convectors can be described as a combination of fluid propulsing devices with integrated forced convecting mechanisms. Designed to behave like blowers or pumps, convectors rely on the disruption of the boundary layer in order to promote heat exchange.

Simple in construction, a convector consists of a stator made up of an array of fixed, parallel, equally spaced, equally thick, thermally conductive plates attached to a relatively thick thermally conductive plate. Convectors are provided with a rotor that is made up of an array of flat, rotatable, parallel, equally spaced, equally thick discs. The discs of the rotor are placed between the plates of the stator at relatively close proximity from the walls of the stator plates. Furthermore, the discs are keyed or held in place with the help of spacers and compression nuts to a hollow or a solid shaft. To allow the free rotation of the shaft, a clearance aperture, circular in shape, is provided on the stator plates. In addition, the shaft is held in place at both ends by roller bearings that provide the means for the shaft to rotate. Convectors running with non-compressible fluids require seals that are also added to the end of the shafts. To impart rotational motion to the rotor, the shaft is attached to an external device such as a motor.

Convectors can be designed to have either perforated hollow shafts or solid shafts. In the case were the device is fitted with a hollow shaft, the shaft serves as a conduit for the fluid to ingress or egress the space between the static plates, the rotating discs and the device itself. Alternatively, convectors designed with solid shafts, require the addition of air passages on the static plates, rotatable discs, and the lateral walls of the external housing. Regardless of whether the shaft is hollow or solid, convectors are also provided with a main exhaust port, nests for bearings, bearings, seals and a casing or shell. To contain the fluid within the device, while the fluid moves across all the surfaces of the stator, a scroll-shaped (a) casing is designed around each disc. This feature is obtained by the addition of fin spacers that allow each disc to rotate within its own cylindrical space while eliminating unwanted spaces and helping push the fluid out. Fins and walls designed with bosses and indentations to create the scroll-shaped (a) casing provide an alternate option. The main exhaust port in convectors is the result of combining many, individual disc exhausts into one. Because the exhaust is tangential to the perimeter of the discs, the exhaust is usually designed to direct the fluids upward or laterally away from the unit, although if convenient, the exhaust can be expelled downwards. Lateral walls, axially perpendicular to the shaft, are designed to have nesting features for bearings that will be utilized in conjunction with the shaft. All convectors are designed to be utilized with compressible and non-compressible fluids. For non-compressible fluids, seals are added to the end of the shaft to prevent leaks. Whether utilizing a single casing or several plates, gaskets may be required to completely seal the device and ensure that the fluid moving through the device exits only at the exhaust port. In operation, a convector's base is placed in intimate contact with the top surface of a heat source utilizing some compressive force. Heat transfer, between the heat source and the base of the convector, is enhanced by applying a thermal compound that fills the voids and minute gaps. As heat moves into the base of the convector, it spreads across it. This causes the heat to travel into all of the stator plates. Rotating discs, placed at a relative close distance from the stator plates, disturb the boundary layer causing the heat to move from the stator plates to the moving fluid surrounding the plates and discs. Moving in an outward radially-spiral motion, the heated fluid exits the system through a tangential exhaust port.

Convectors can be utilized in many commercial, medical, military and laboratory applications (just to name a few) where the need for an effective mechanism of heat management is sorely needed. Examples of application of convectors include cooling of high power electronic components, cooling of high power resistors, cooling of illumination LED-based devices, etc.

Convectors have a unique set of characteristics that makes them highly desirable as active heat sinks. For example:

Convectors can be utilized to work with gases, liquids or both mediums;

Convectors are fully reversible, meaning that the inlets of a convector can be made to behave as exhausts and the exhausts as inlets, simply by rotating the motor in reverse;

The performance of the heat exchanging section of a convector does not change when running in reverse mode;

Because of their design, convectors will have low debris and dust collection;

Convectors, provided with a compression system for the discs, can be operated in a vertical orientation (where the shaft is parallel to the surface acting as the base of the device) or in a horizontal orientation (where the shaft is perpendicular to the surface acting as the base of the device). The addition of a compression system consisting of washers, spacers, nuts, and screws, help to fix the position of the discs on the shaft, preventing the discs from rotating about the shaft or moving along its length.

Convectors behave, by design, like water-pumps or like air-blowers;

Convectors can be further specialized as volume-blowers, pressure-blowers, volume pumps or pressure pumps by simply changing the diameter of the discs or modifying the shape of the scroll-shaped (σ) casing;

Convectors' performance can be further improved by modifying the surface of the stator plates and/or the surface of the discs;

Convectors built with smooth discs can be expected to run quietly;

Convectors can be ganged up in series, utilizing a single motor to provide rotational motion to several devices;

Convectors can be utilized in conjunction with heat pipes or with vapor chambers for effective management of hot spots on components that need critical thermal control;

Because convectors behave like blowers, their performance is not noticeable affected when the hot exhaust and/or inlet is/are channeled to or from a preferred location utilizing extra conduit.

Convector in Operation (Hollow Shaft)

To describe the behavior of a convector in operation, we will consider an application, where a small convector will be utilized to maintain the case temperature of a high power electronic component (i.e. a microprocessor) to some pre-determined temperature limit.

Convectors utilized to cool high power electronic components such as microprocessors can be designed with heat sink structures acting as stators. As such, convectors of this kind can be fitted with a mounting mechanism to attach the device over the electronic component in order to apply the right amount of pressure. To obtain a good thermal contact and reduce the thermal resistance between the convector and the electronic component, thermal grease with high thermal conductivity should be applied between the convector's base and the top of the electronic component before finalizing the attachment of the convector.

The base and the fins of the stator should preferably be made from high thermal-conductive materials (i.e. aluminum, copper, graphite, CarbAl®, KFOAM®, etc.). The surfaces of bases of this kind of convectors require being as smooth as possible and with flatness equal or better than ±0.0005 inches [~13 micrometers] to be effective when in contact with the electronic component. The thermal grease that is added between the convector and the electronic component is utilized to fill the void and crannies mostly on the surface of the electronic component's case. With the help of good interface thermal compound (i.e. Artic Silver 5), heat would move away from the case of the microprocessor and into the base of the stator, making the base to behave as a heat spreader. Fins or stator plates, made from highly conductive materials and directly attached to the base of the stator, would move the heat quickly away from the base. Assuming that the rotor of the convector is moving at some relatively high rotational speed, the rotation of the discs would make the discs drag along the air between the surfaces of the stator fins and the surfaces of the discs. The discs in all convectors are designed to rotate at a short distance, ~0.010-0.080 inches [~0.25-2.00 millimeters], from the surfaces of the fins or the surfaces of the plates that make up the stator and due to the resistance to move, that all of the rotating components and air experience, the boundary layer at the fins gets disturbed. The heat from the base that has moved into the fins would then be carried away convectively by the air that is being pushed outwardly in a radially-spiral motion due to the centrifugal force generated by the spinning discs. The volume of air moved away by the spinning discs would be replenished through apertures or passages along the length of the shaft and at the inner edge of the discs that rest against the shaft. Two main air intakes, located at both ends of the shaft would provide all of the air required to maintain a continuous flow through the convector. Because convectors are blowers (or pumps) by design, the warm-exhaust air would be expelled away from the convector with a substantial force. If needed, an exhaust pipe over the exhaust port of the convector could be utilized to send the warm-exhaust air outside the case to prevent recirculation by the convector. It can be safely assumed that the air at close proximity of the convector would be roughly at room temperature or slightly above room temperature (i.e. 68° F. [20° C.]), and if the fins or plates of the stator were to acquire a higher temperature (i.e. 97° F. [36° C.]) the difference in temperatures between the fins and the supplied air would be large enough for an effective forced-convective transfer to take place.

It should be noted that, unlike any currently known devices, convectors with heat-sink-like structures are designed to make every single surface of the stator (in close proximity to the surfaces of discs of the rotor), help distribute the heat rejected by the source into the base of the convector. This is done in conjunction with the rotor's discs that are also purposely designed to remove the heat travelling through every single surface of the vertical walls that make up the stator and the lateral walls of the convector and because the stator is made up of many vertical, closed-spaced, long and wide thin plates, the outcome is that the base experiences an even heat distribution over the entire surface and any potential hot spots are eliminated.

Convectors are highly versatile and their heat exchanging performance can be modified and improved in several ways. For example, in the application related to controlling the temperature of an electronic component, if the need for higher heat removal would've arisen, the motor could've been made to spin faster in order to increase the volume of fresh air moving through the device; or, thicker discs could've been utilized to reduce the gap between discs and plates in order to reduce the boundary layer; or, the smooth discs could've been replaced with discs with modified surfaces in order to enhance the degree of disturbance of the boundary layer; or, the stator could've been replaced with an stator carrying more plates along with a rotor with more discs in order to improve the cooling capabilities of the device. One of the unique features of convectors is that they can be pre-designed to use either air or water as a cooling medium. When a convector is designed to be utilized along with water, seals are added at both ends of the shaft to prevent leaks and the exhaust port and fluid intakes are channeled through an external heat exchanger. Because convectors are pumps per-design, there is no need to add a water pump, but because of the difference of the densities and viscosities of the cooling medium, motors with higher power requirements are utilized.

BRIEF DESCRIPTIONS OF THE DRAWINGS

The foregoing and other features and aspects of the invention may be best understood with reference to the following description of certain exemplary embodiments, when read in conjunction with the accompanying drawings, wherein.

Figure 27:
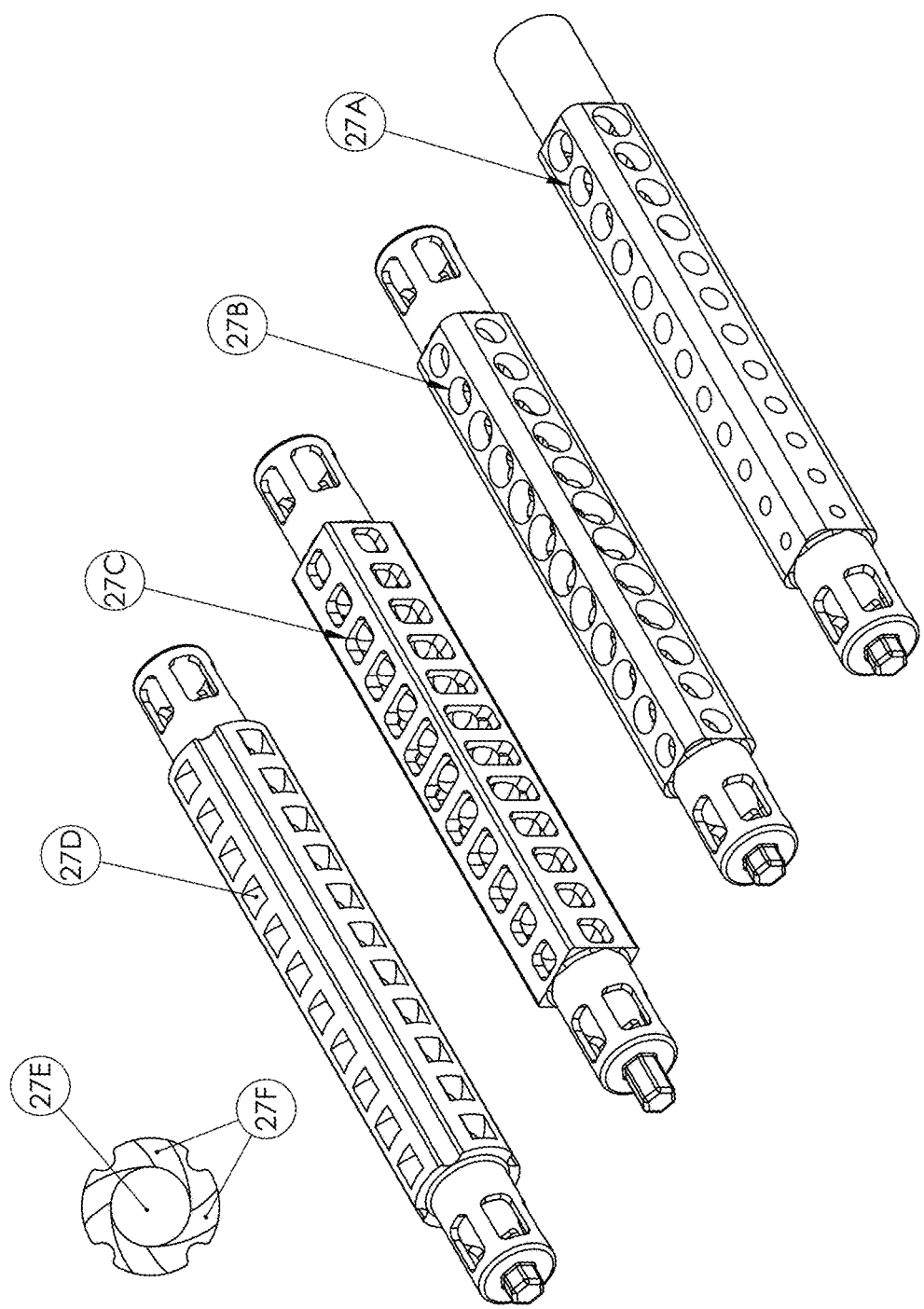

FIG. 27 presents the perspective view of various hollow shafts and a cross-sectional view of a hollow shaft with openings designed to impart a rotational motion to the fluid.

Figure 28:
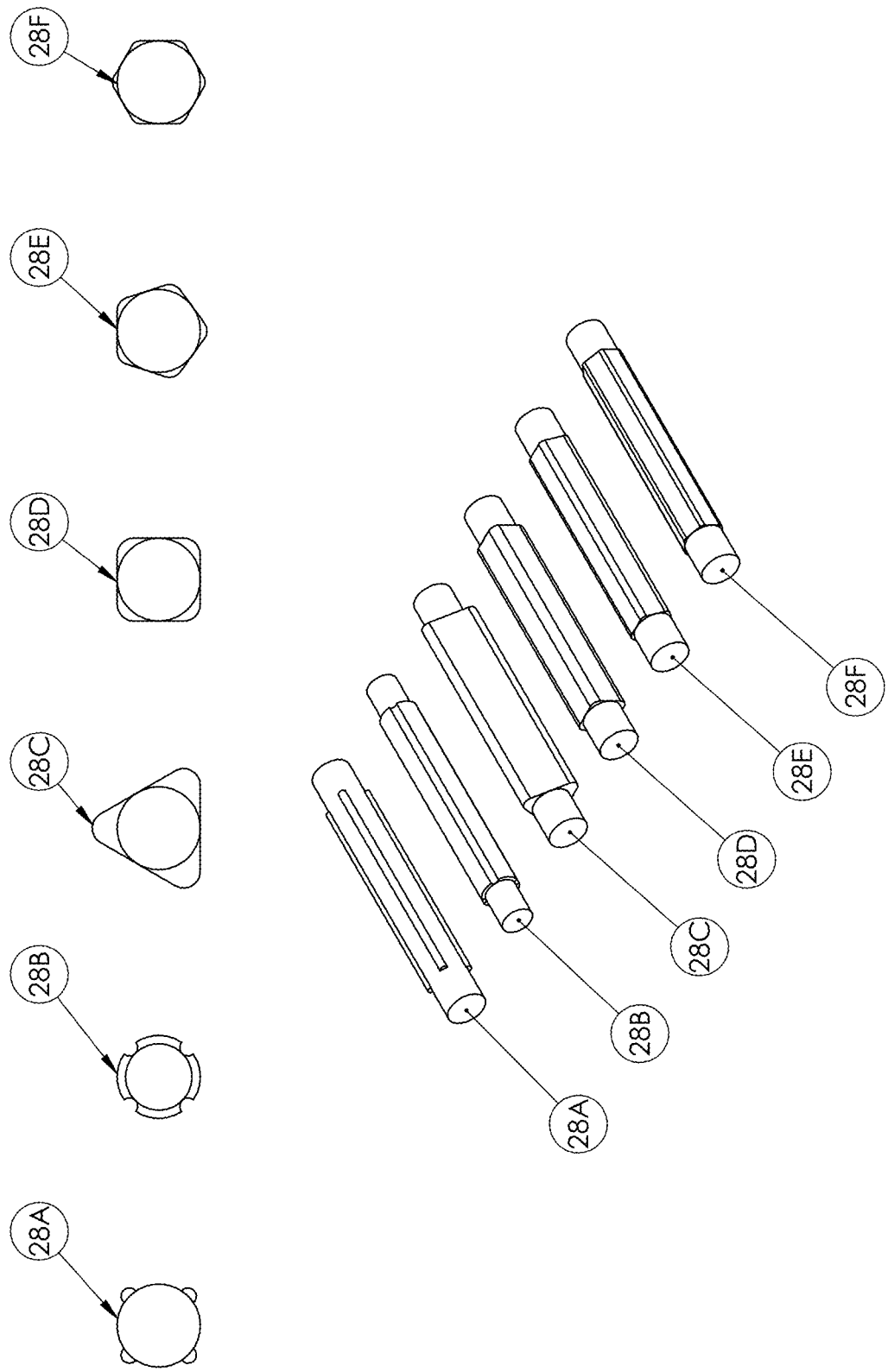

FIG. 28 depicts the perspective view of various solid shafts with relative small shaft-diameter designs and respective cross-sectional geometries.

Figure 29:
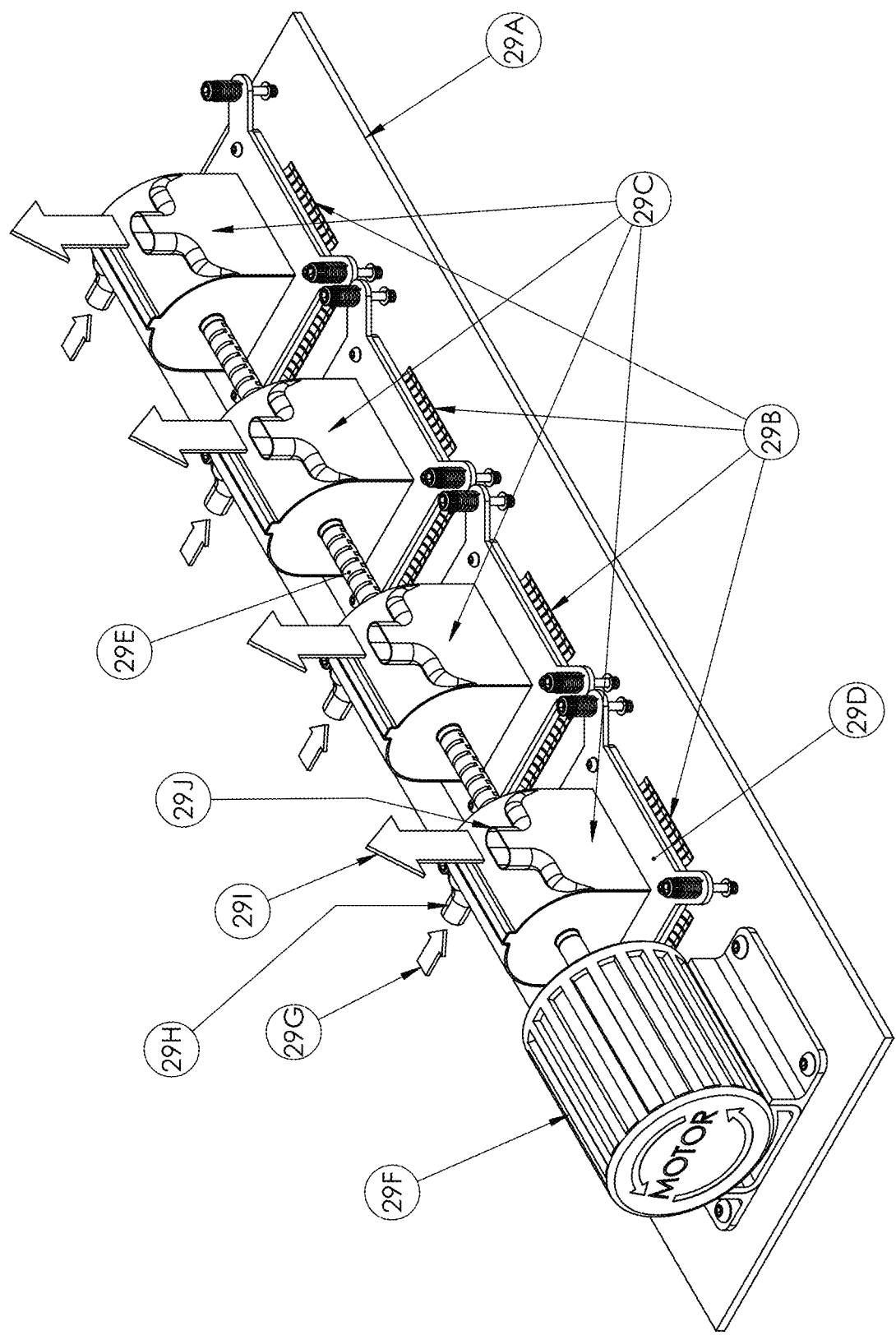

FIG. 29 presents the perspective view of several convectors set-up in series for a cooling application related to high power electronic components.

Figure 30:
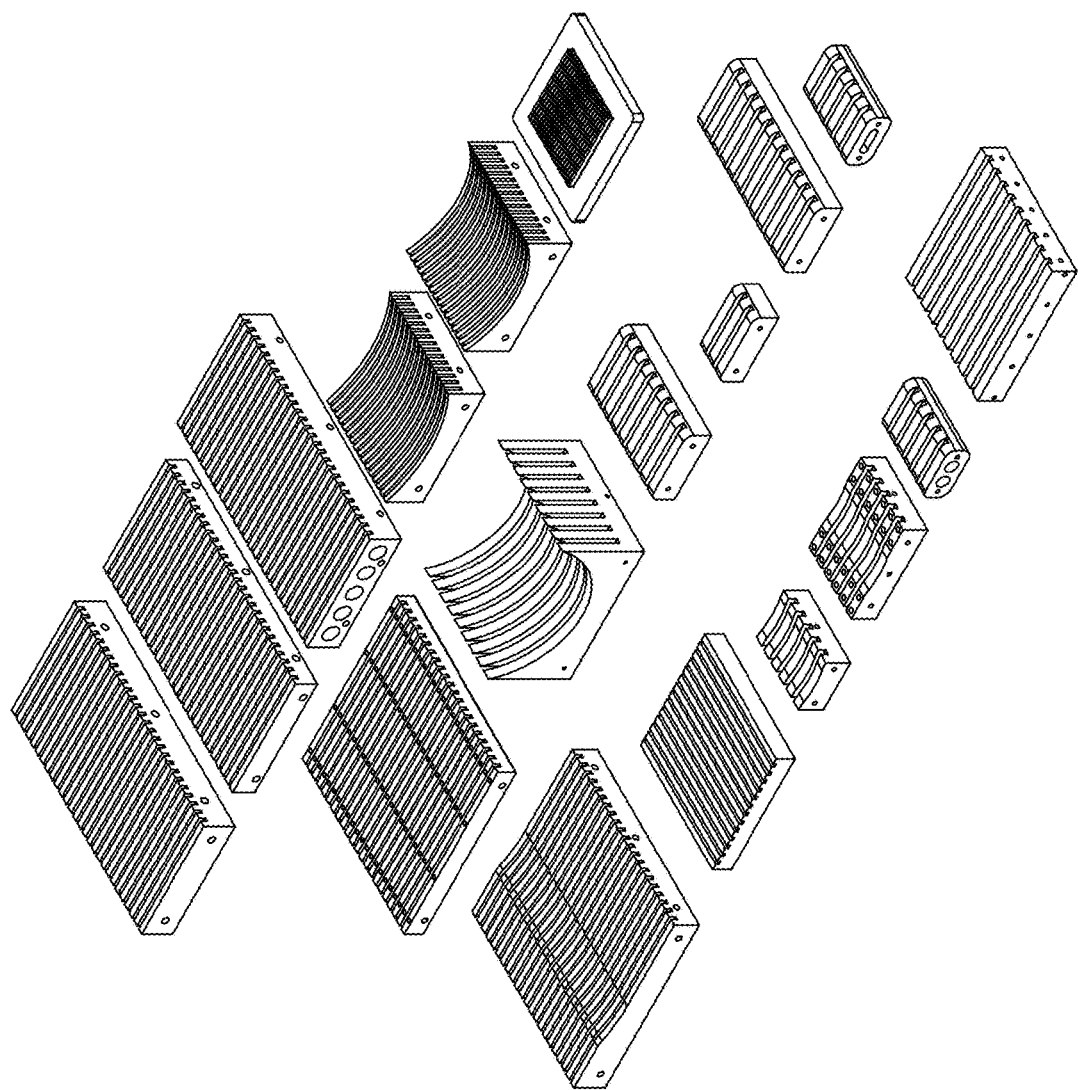

FIG. 30 presents the isometric view of various base designs.

Figure 31:
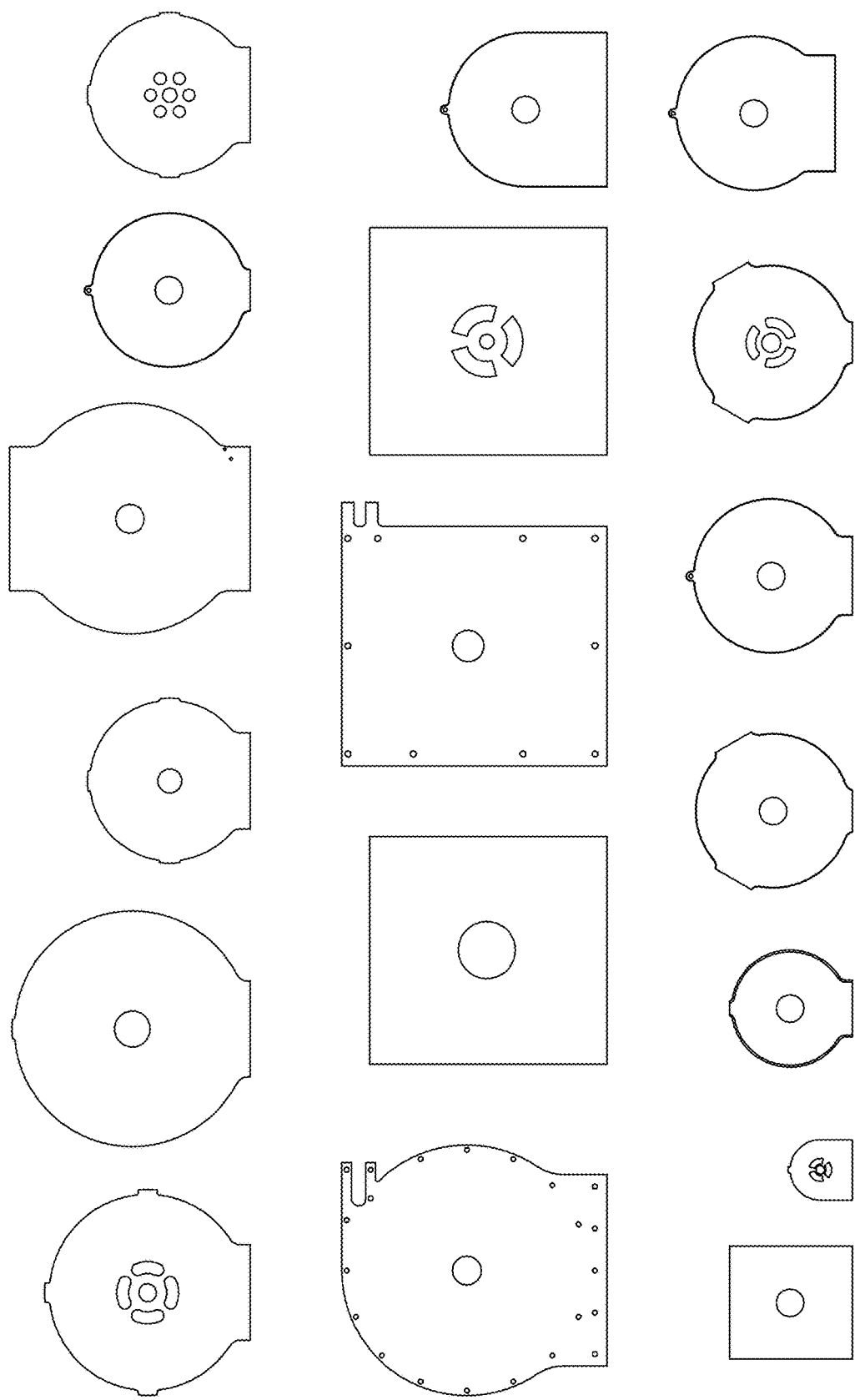

FIG. 31 showing the isometric view of various flat-fin design geometries.

Figure 32:
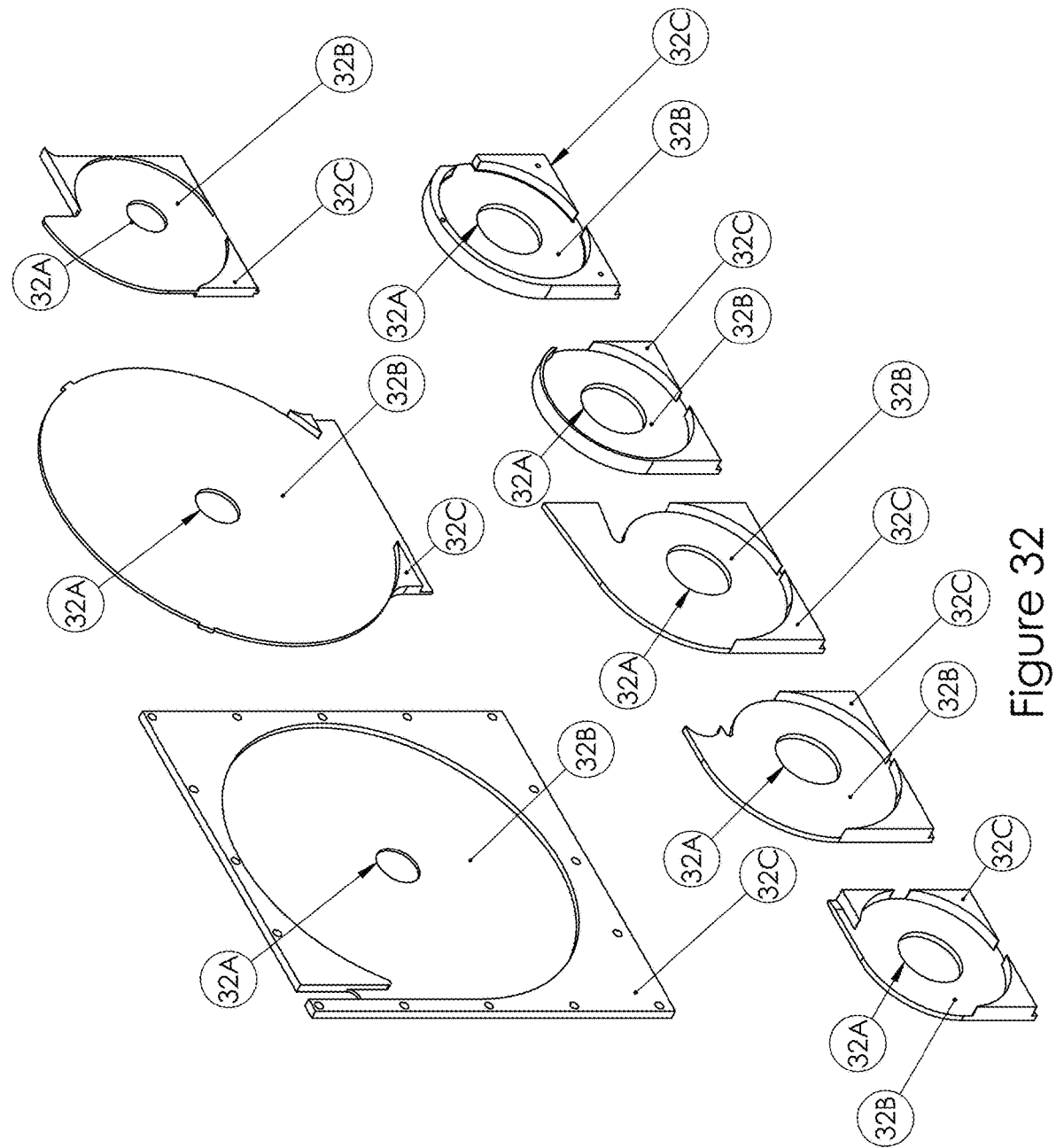

FIG. 32 showing the isometric view of various fins with built-in structures (bosses and indentations).

Figure 33:
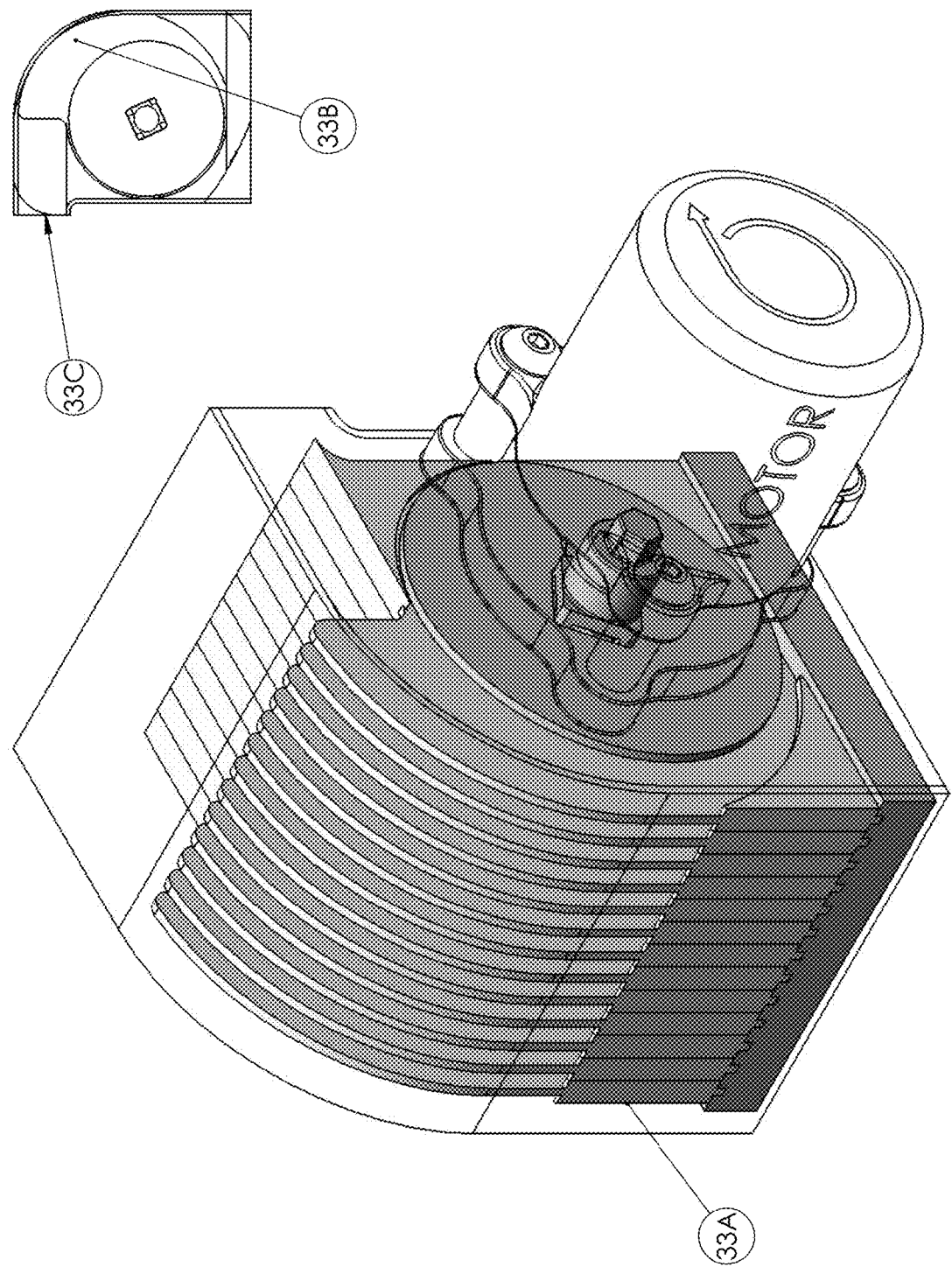

FIG. 33 showing the isometric view of a convector design based on non-flat fin structures.

Figure 34:
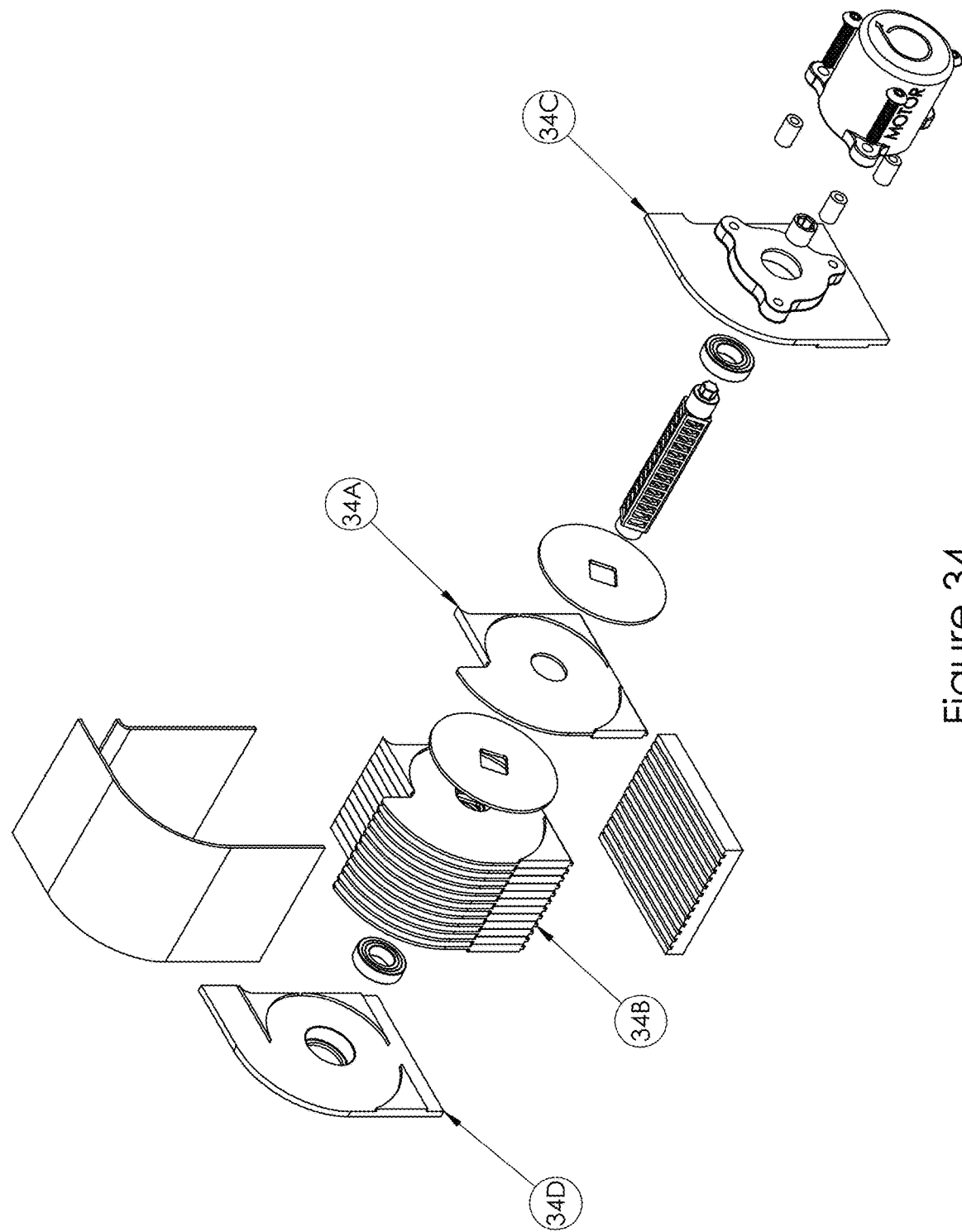

FIG. 34 is the exploded view of the convector shown in FIG. 33.

Figure 35:
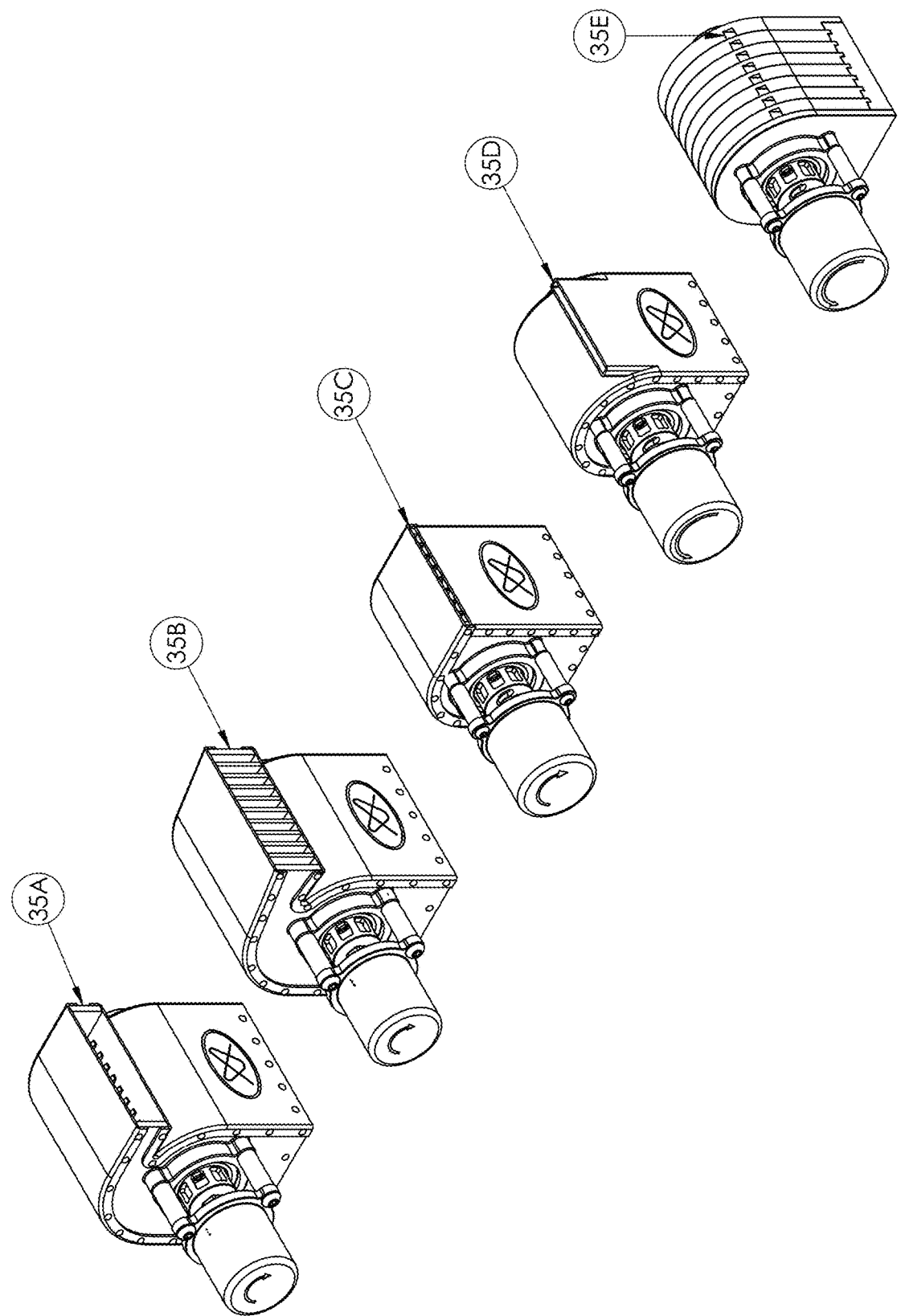

FIG. 35 showing the isometric view of volume convectors and pressure convectors.

Figure 36:
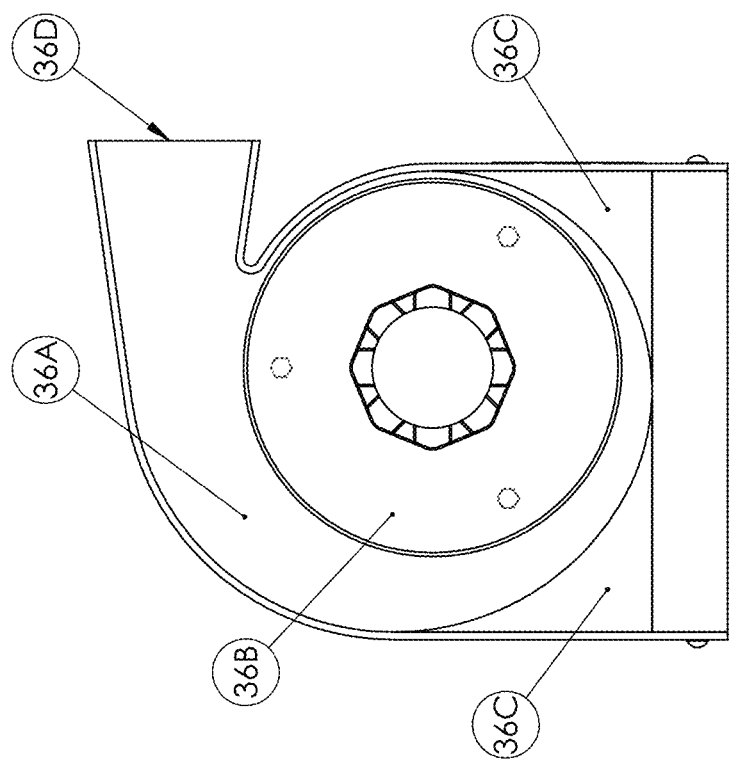
Figure 36:
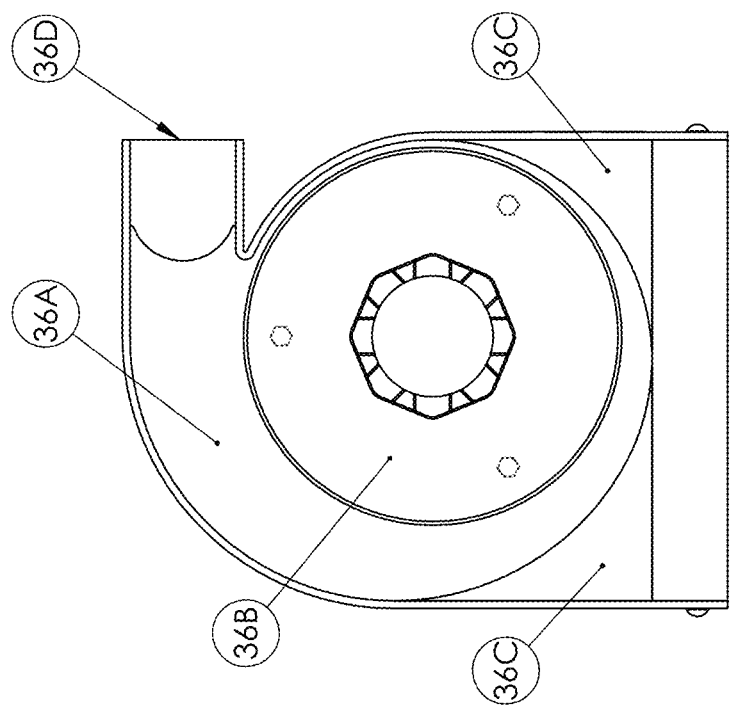

FIG. 36 presents the cross-sectional view of two volume convectors.

Figure 37:
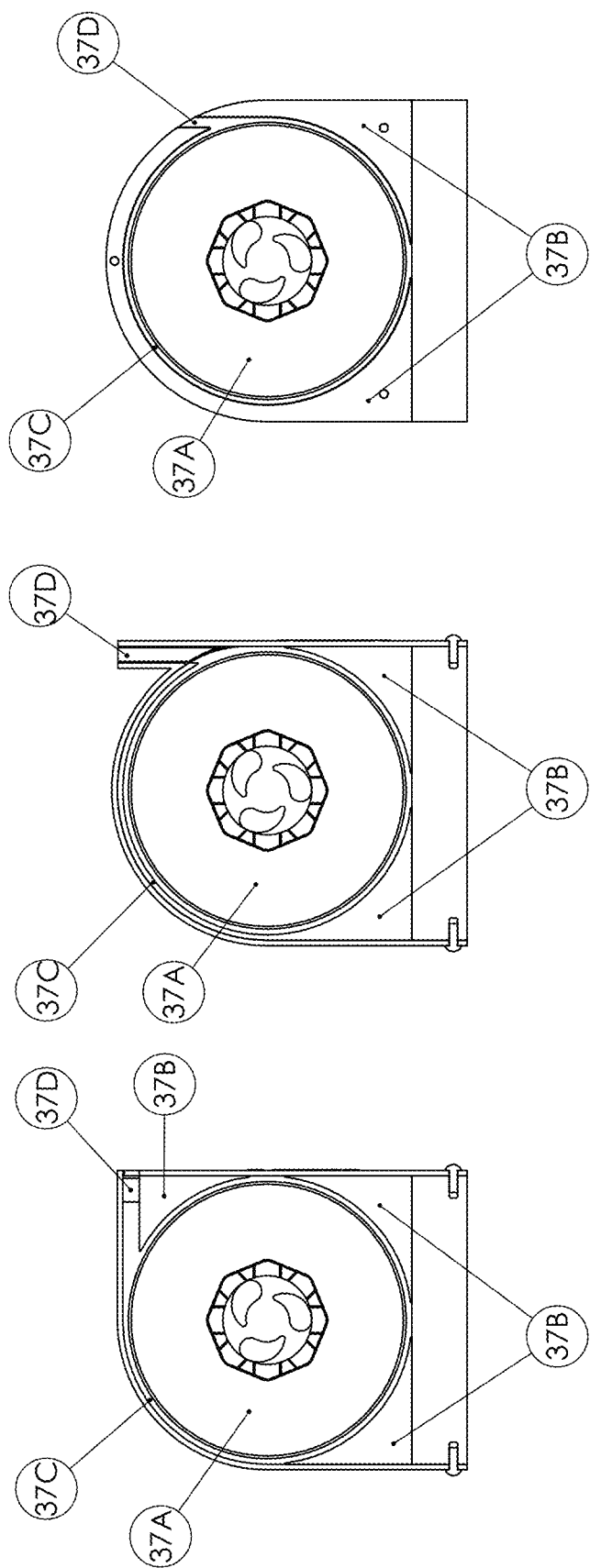

FIG. 37 showing the cross-sectional view of three pressure convectors.

DETAILED DESCRIPTION OF THE INVENTION

The present invention generally relates to novel devices, methods and systems for facilitating the convective transfer of heat by the movement of fluids utilizing a plurality of equally parallel and spaced rotating discs and static plates using the disruptive boundary layer mechanism.

Figure 1:
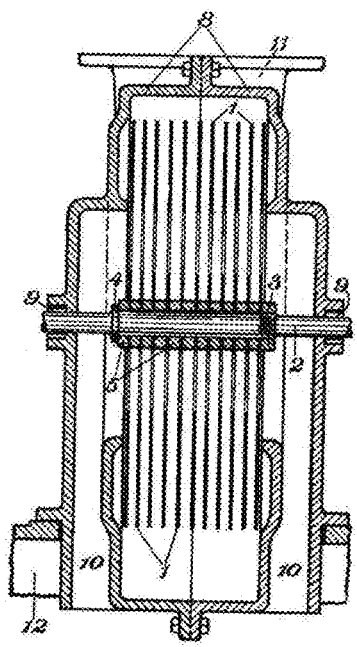
FIG. 1 is a view of a prior art blower or pump.
Figure 2:
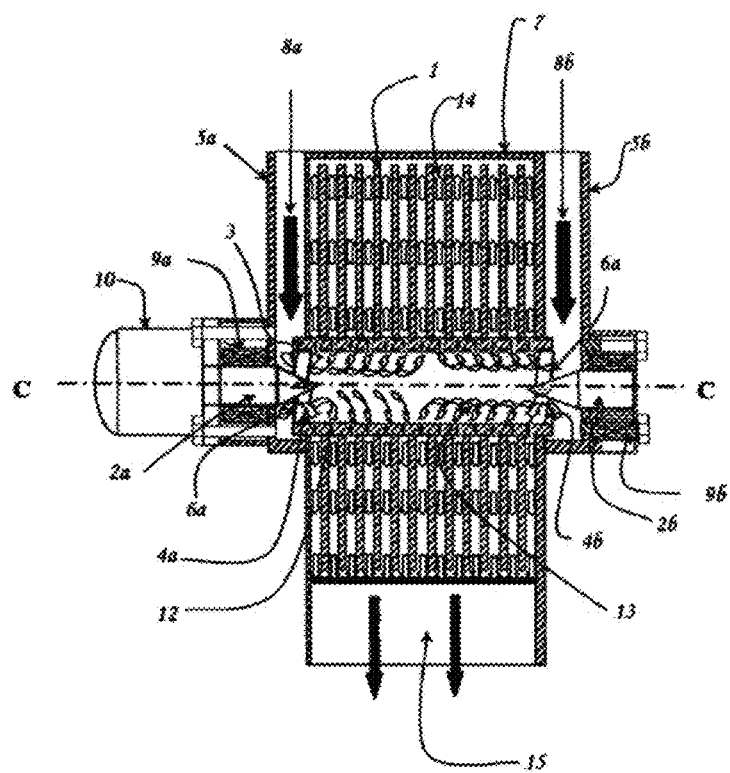
FIG. 2 is a view of a prior art cycle boundary layer turbine.
Figure 3:
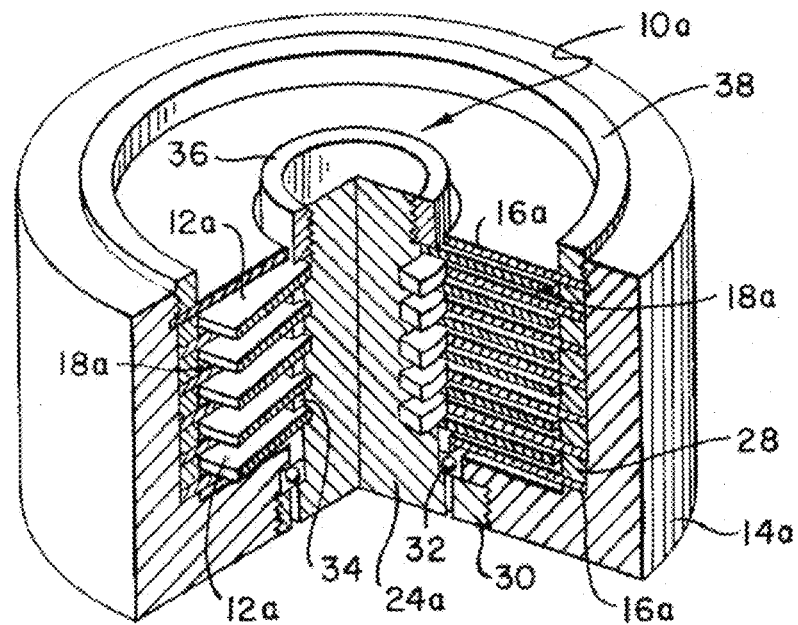
FIG. 3 is a view of a prior art cylinder with rotating flat discs and fixed fins.
Figure 4:
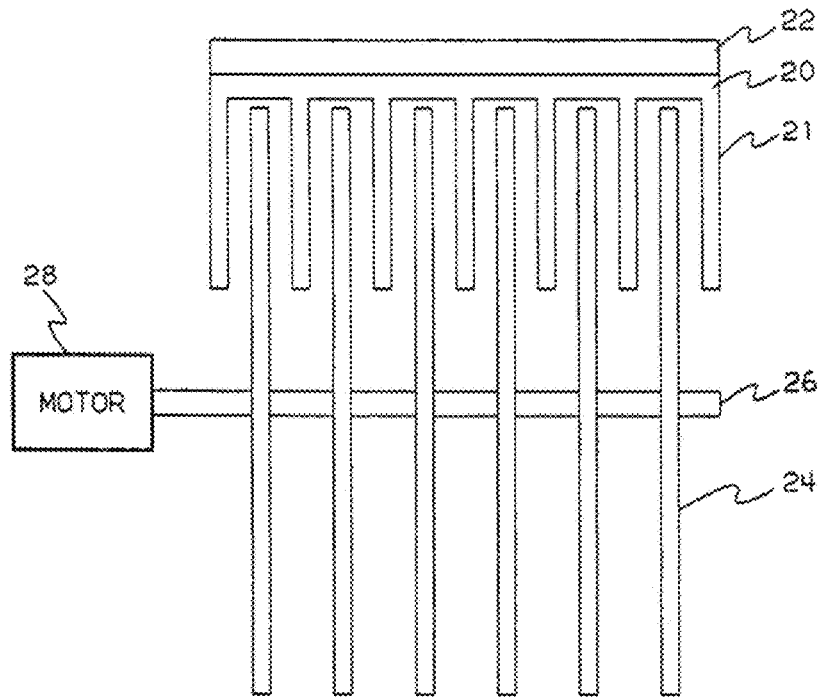
FIG. 4 is a view of a prior art disk augmented heat transfer system.
Figure 5:
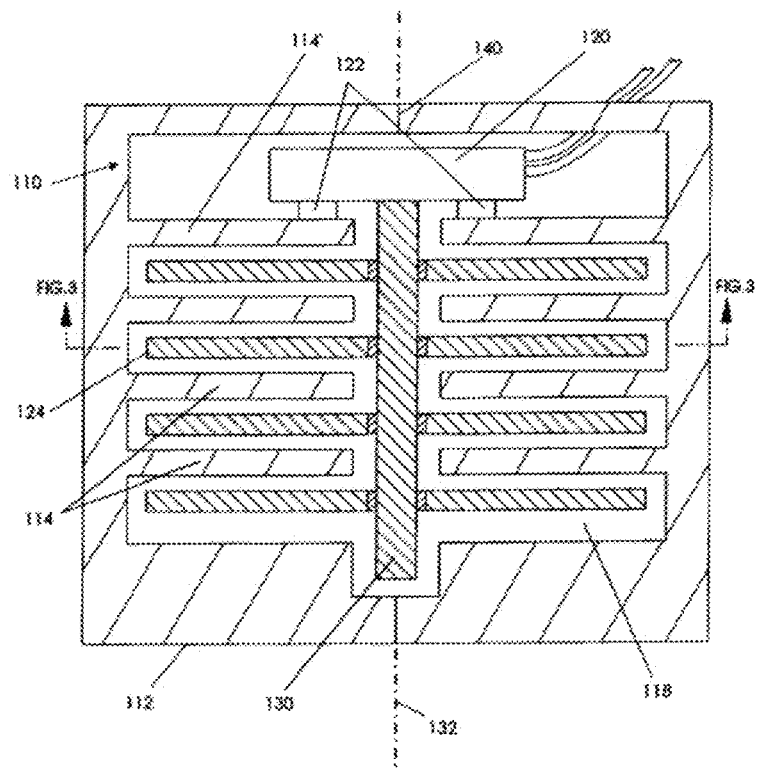
FIG. 5 is a view of a prior art forced air cooling apparatus for semiconductor chips.
Figure 6:
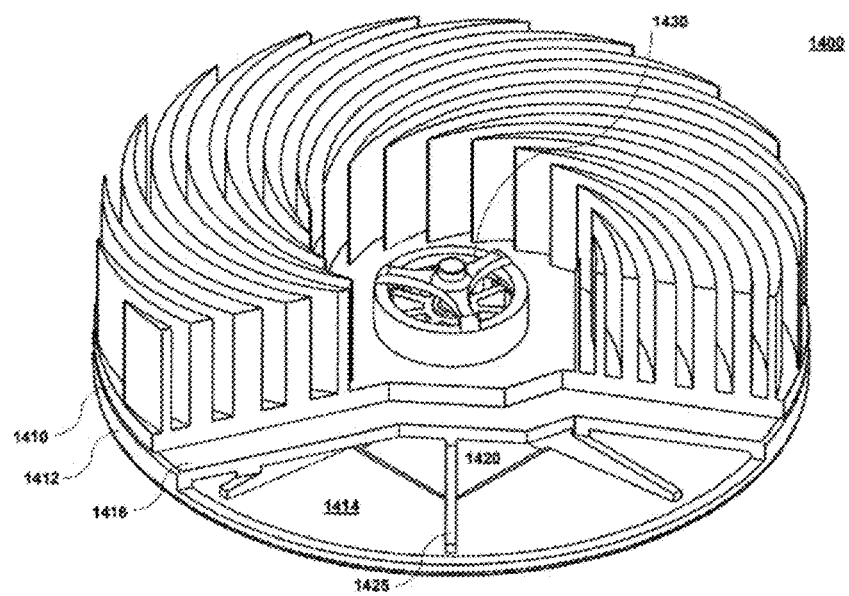
FIG. 6 is a view of a prior art spinning heat sink.
Figure 7:
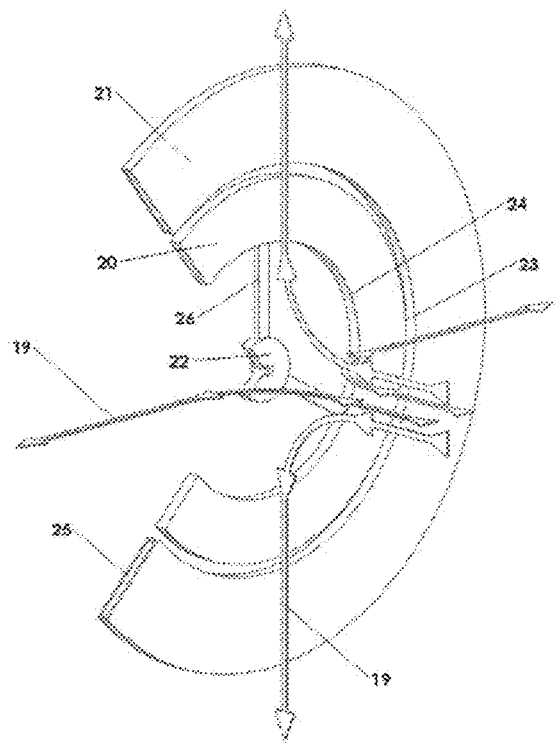
FIG. 7 is a view of a prior art toroidal fluid mover. [0035]
Figure 8:
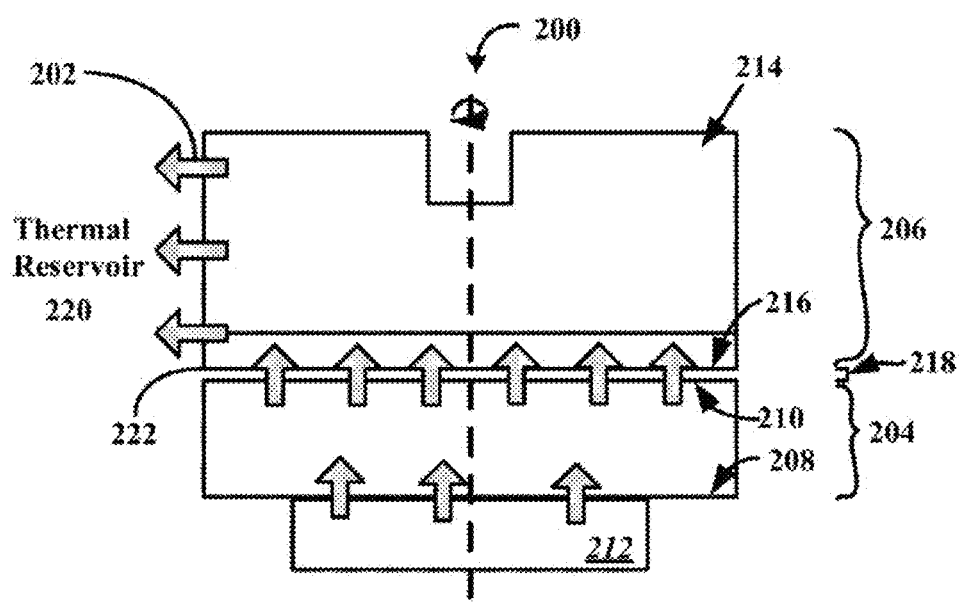
FIG. 8 is a view of another prior art spinning heat sink.
Figure 9:
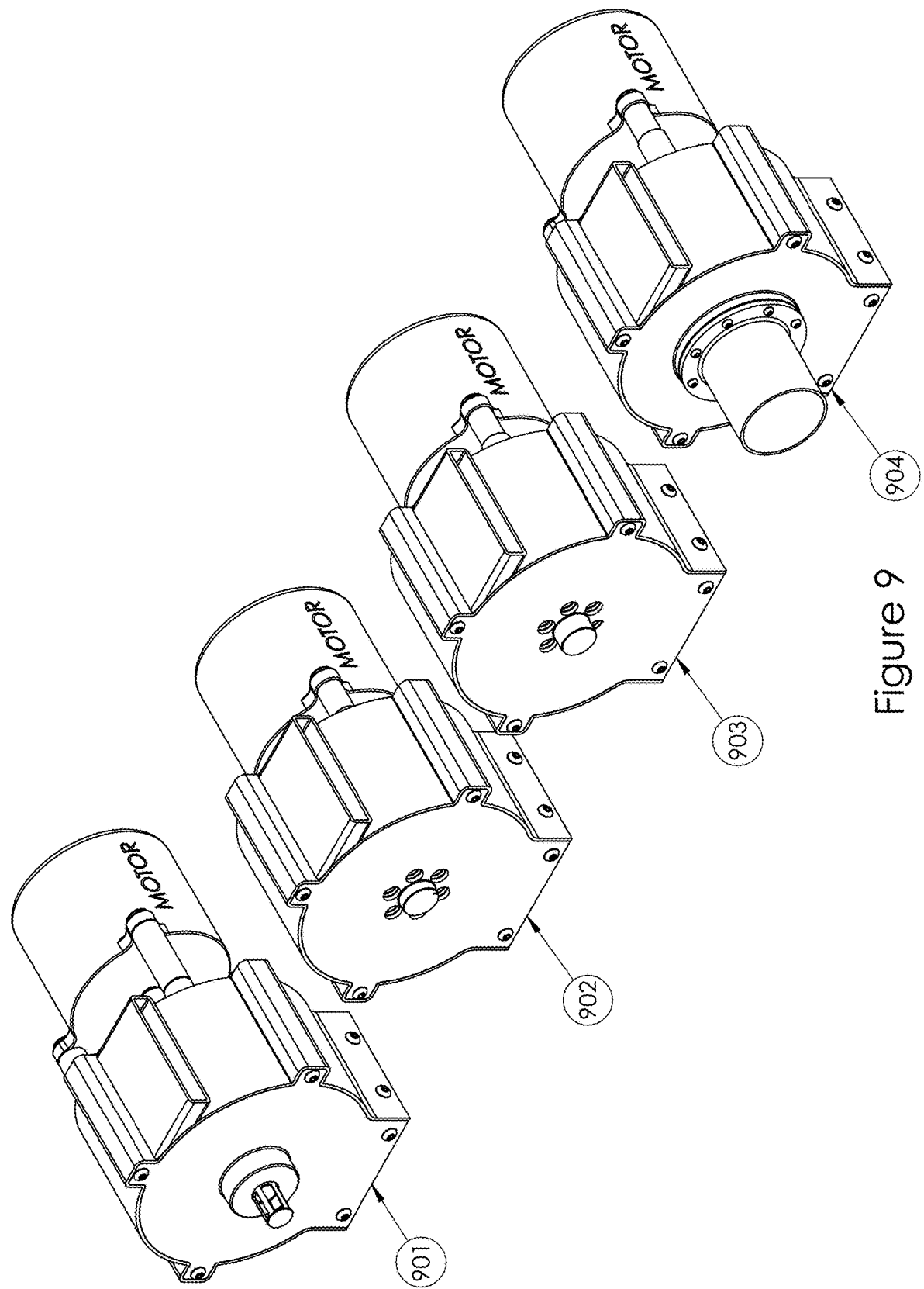
FIG. 9 is a perspective view of four basic convectors in accordance with exemplary embodiments.

FIG. 9 shows four characteristic designs for novel convectors utilized in applications related to the transfer of energy, in the form of heat, from or to a fluid utilizing a combination of interleaved flat-static plates and flat-rotating discs, where the surfaces of the discs and plates are located at relatively close proximity from each other. Furthermore, the cross-sectional shape of these devices (referred here and thereof as a scroll-shape (σ)), is purposely designed so that the devices behave as fluid propulsors while simultaneously acting as energy (heat) transferring devices utilizing convective mode energy transfer mostly by boundary layer disruption on the surfaces of the stator plates. The devices shown differ from each other by slight external variations, but much pronounced internal differences. For example, 901 is a device designed to include a hollow shaft with openings at both ends. The openings serve the purpose of fluid intakes. These types of devices have discs that are not attached to the shaft and are able to move freely over the shaft as the device is assembled. Once in place, the discs can be fixed in position by expanding the walls of the hollow shaft causing and interference fit between the inner edge of the discs and the outer wall of the shaft. In designs where the rotor is assembled separately, other methods to anchor the discs to the hollow shaft can be utilized. 902 shows a device designed with a solid shaft that also has freely moving discs. These types of devices require radially intake openings to surround the shaft on the back and frontal walls, the rotating discs and the stator plates. 903 is another device that is designed with a solid shaft, but, unlike the devices of 902, the discs are held in place with a compression system consisting of disc spacers and compression mechanisms located at both ends of the shaft with the rest of the design characteristics remaining the same. 904 presents a device designed for non-compressible fluids and it is also designed utilizing a solid shaft with a compression system plus seals to prevent the fluid from leaking. These devices can have one or two fluid intake ports.

Figure 10:
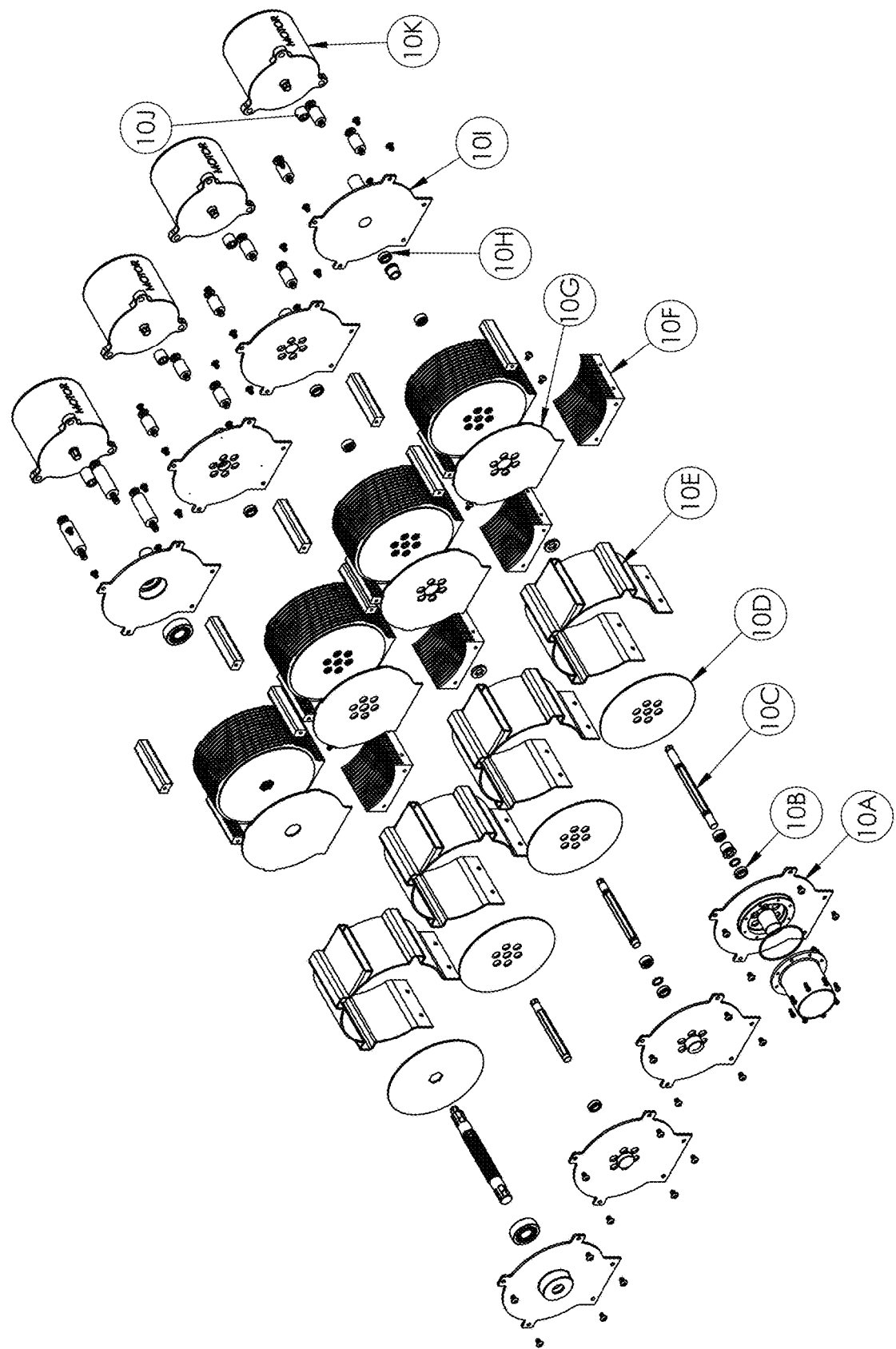
FIG. 10 is an exploded illustration of the convectors shown in FIG. 9.

Regardless of the application on hand, most convectors share a large number of characteristic design parameters and components. FIG. 10 shows some of these common components including a frontal plate 10A, a bearing at the frontal end of the shaft 10B, a shaft 10C, circular discs 10D, a cover or casing 10E, a base 10F, fins 10G, a bearing located on the back end of the shaft 10H, a back plate 10I, a coupler 10J and a motor 10K.

Figure 11:
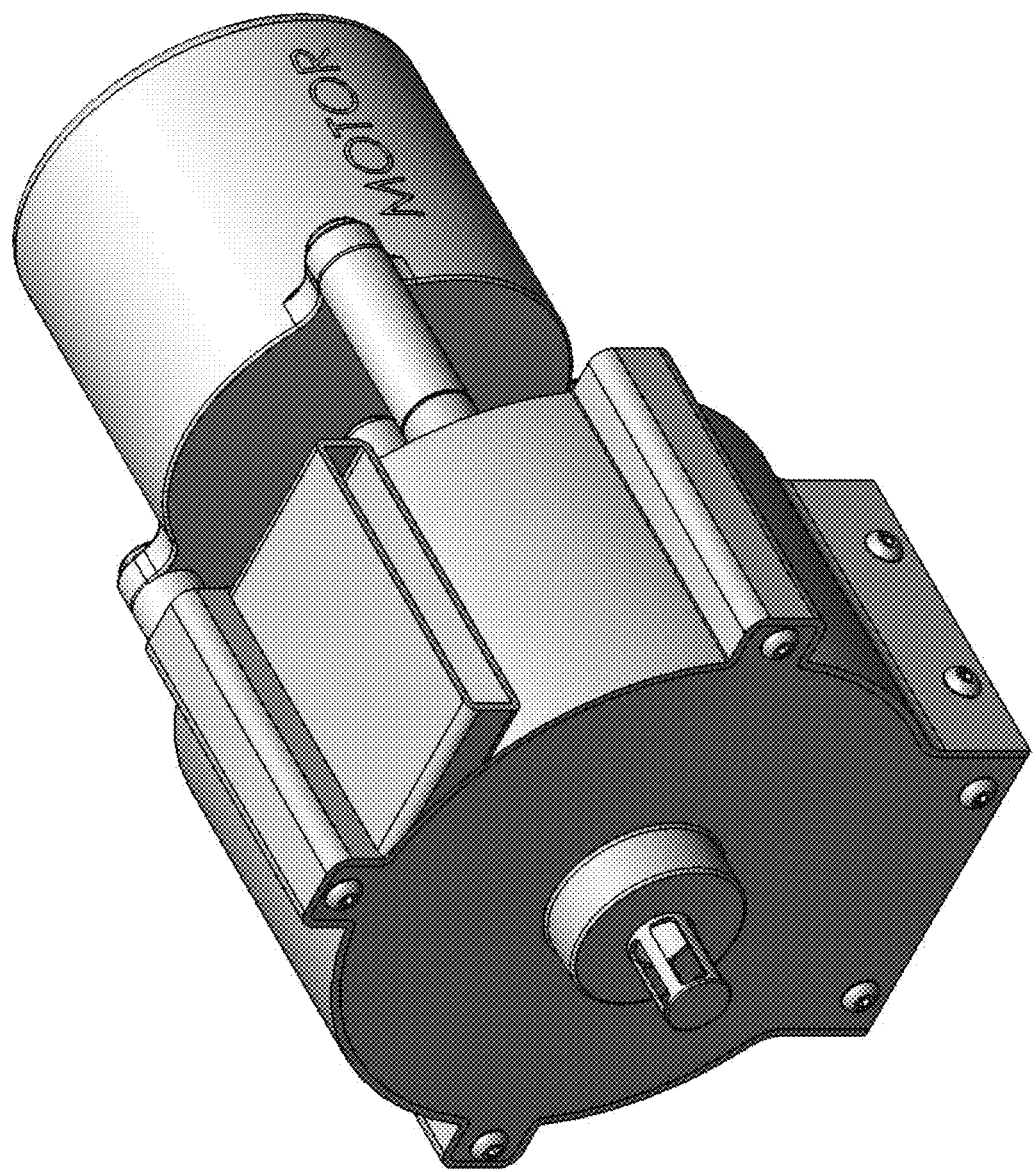
FIG. 11 is a perspective view of a convector embodiment with a hollow shaft.

Simple in design, novel scroll-shaped (σ) convectors, such as the one shown in FIG. 11, have just a few characteristic external features. These features include frontal and back fluid intakes, a top fluid exhaust, components to mount the motor against the casing of the convector (bosses, spacers and screws), a device that provides rotational motion (motor), a mechanism to attach the motor to the shaft (coupler), a flat base and in most cases a scroll-shaped (a) casing. The assembly (FIG. 12) of the convector includes a frontal plate 12C, provided with a nesting feature 12A to hold and retain a bearing 12D and an opening 12B to clear the end of a shaft 12H. An array of flat discs 12G are provided with an opening 12F, such as the one shown on disc 12E, allows the discs to be inserted onto a shaft 12H. The discs 12G are placed between fixed, static plates 121 that are in intimate-thermal contact with a base 12K. A circular opening 12J is provided on all of the static plates to allow the shaft 12H to rotate freely. To provide stability to the static plates, extra holding bars are provided as shown in the close view 12L. A motor 120, held in place with screws and spacers 12Q is attached to the shaft with the help of a coupler 12P. A scroll-shaped (σ) casing 12M is provided with an exhaust port 12N to let the exhaust fluid escape the device.

Figure 13:
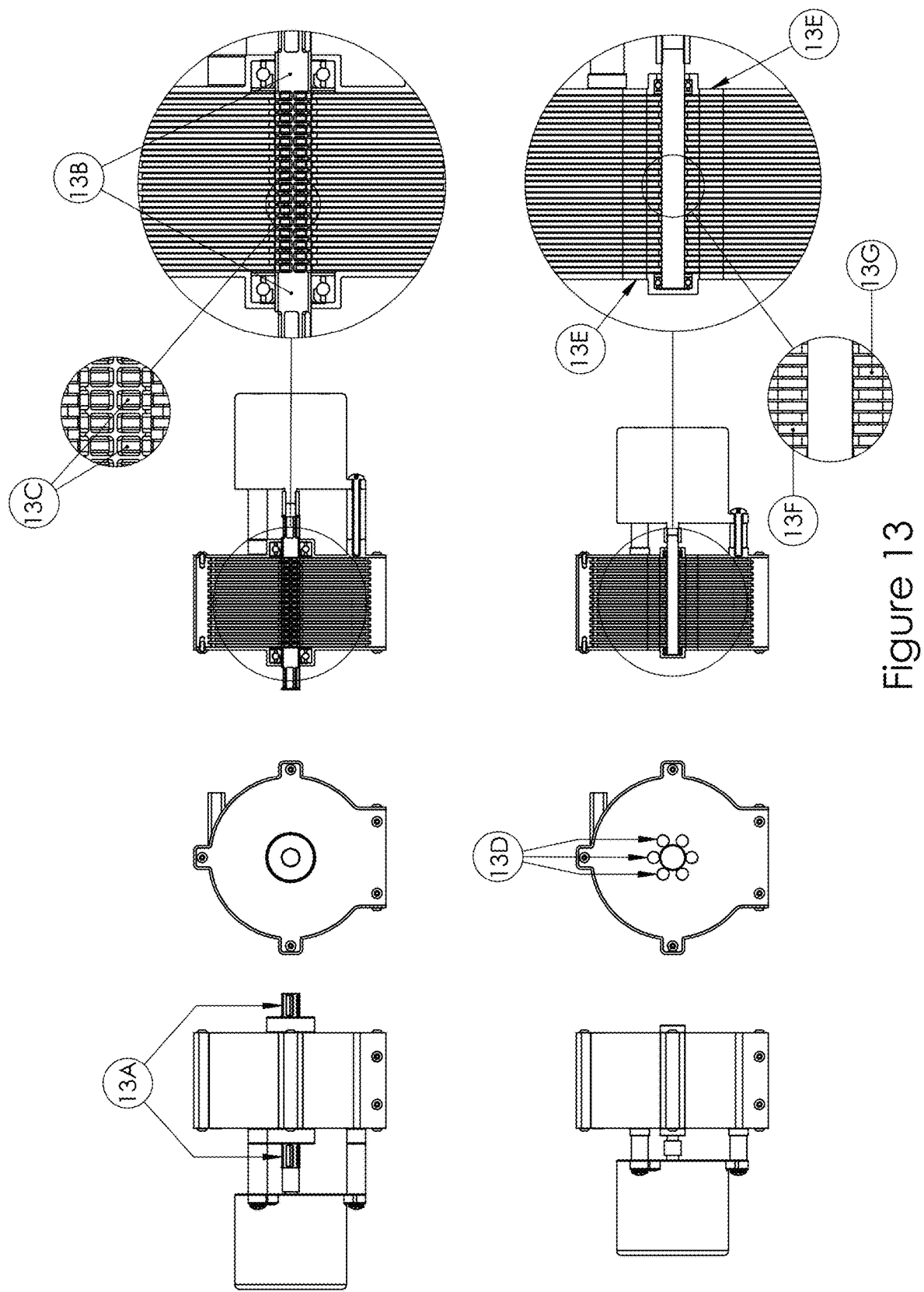
FIG. 13 illustrates the comparison between convector embodiments with solid and hollow shafts.

Convectors design versatility allows the use of hollow shafts or solid shafts. FIG. 13 shows the main fluid intakes on a design that includes a hollow shaft. In designs such as these, the main fluid intakes are located at both ends of the shaft 13A with a fluid passage that covers the entire length of the shaft 13B and that includes multiple fluid passages 13C, so that the fluid entering the device gets distributed between the fins and the rotating discs. In contrast, a convector designed with a solid shaft is provided with fluid intake openings located at both the frontal and back walls of the device 13D. These openings are also provided on all of the components within the device such as the discs 13F and the static plates 13G making a continuous set of fluid passages that run the length of the device 13E. Although convectors do not have a rotor per se, the overall assembly of discs and shaft within the device makes them behave rotor-like.

Figure 14:
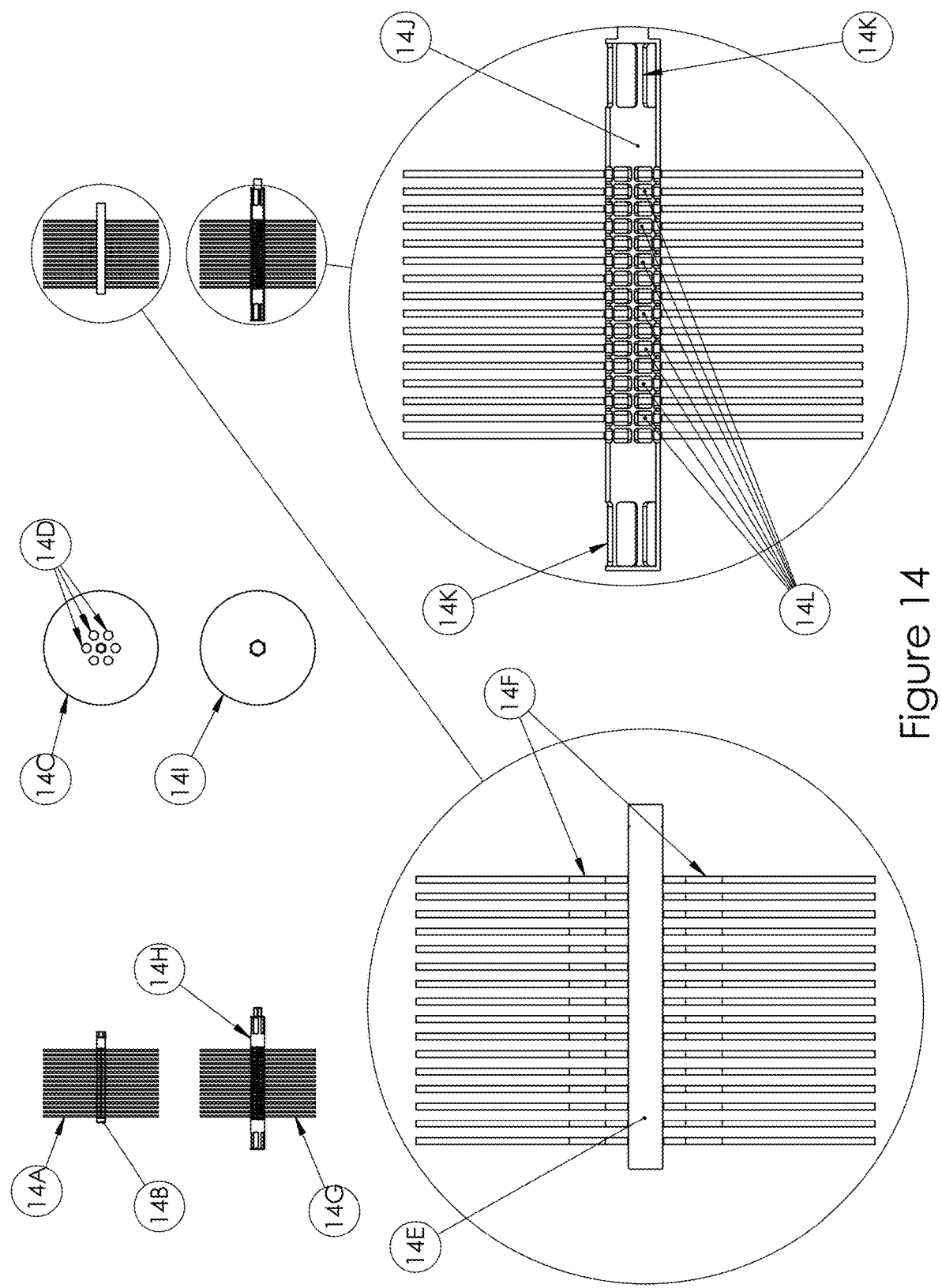
FIG. 14 illustrates the comparison of rotors with solid shafts and rotors with hollow shafts.

FIG. 14 compares rotors made with solid shafts 14B and hollow shafts 14H. Both assemblies consist of an array of flat-parallel discs equally spaced 14A and 14G. Rotors with solid shafts have flat-circular discs 14C that are provided with several openings 14D surrounding a central hole intended to clear the rotating shaft. The openings on the discs are intended to create several continuous fluid passages 14F. Rotors designed with hollow shafts 14H get populated with flat-parallel, equally spaced discs 141 that have a single central opening intended for the shaft 14H. Hollow shafts are intended as conduits for the fluid that enters the device. The fluid enters the device via two sets of fluid intakes located at both ends of the shaft 14K, and moves within the shaft through a central passage 14J. The fluid is dispersed between the discs (and plates) with the help of many fluid openings 14L located on the sides along the length of the shaft.

Figure 15:
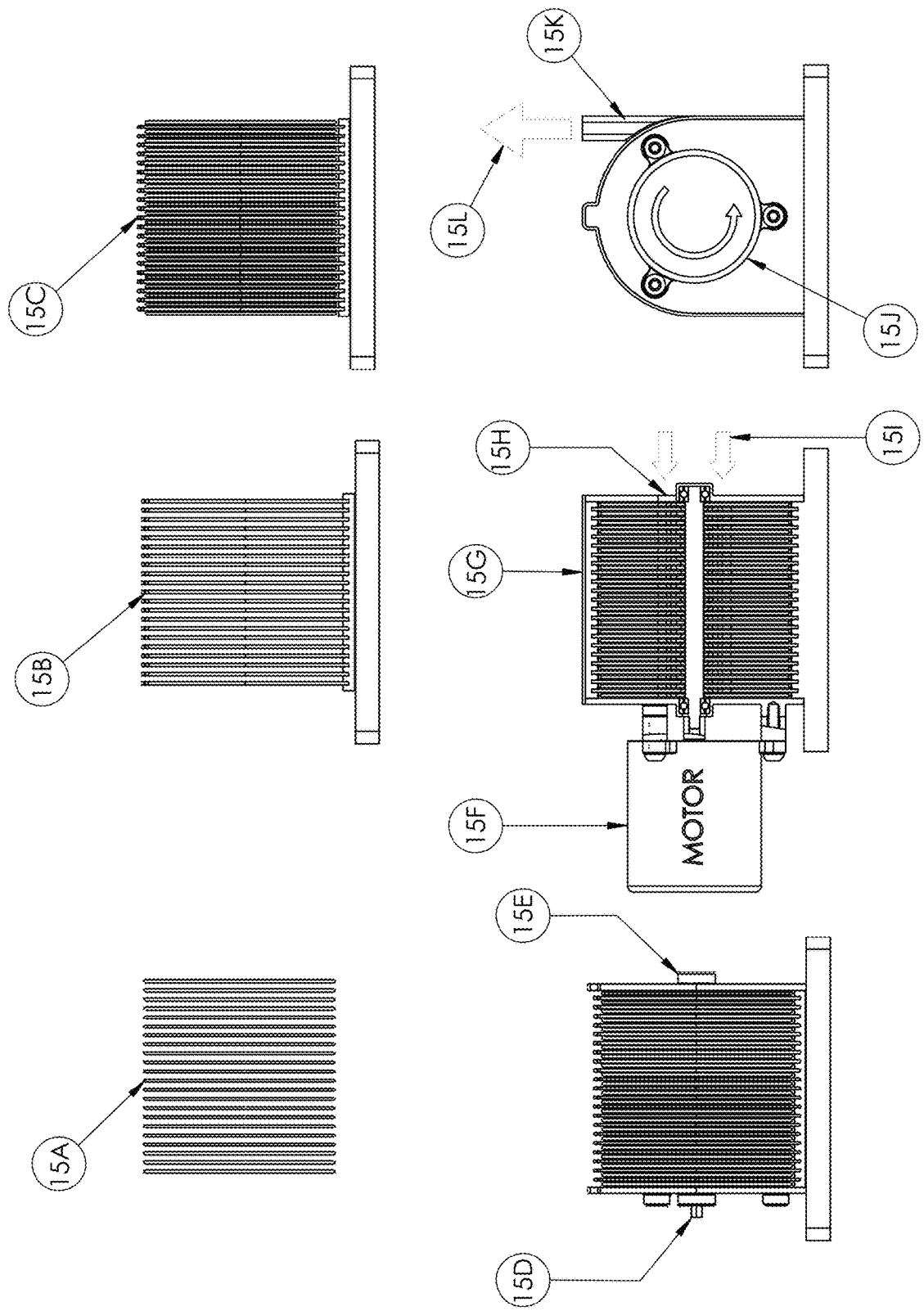
FIG. 15 shows a basic convector design, components and basic operation details.

A typical convector (see FIG. 15) is designed to have a multiple number of flat-parallel discs 15A and a multiple number of flat plates 15B that are interleaved 15C in a manner such that the surfaces of the discs and the surfaces of the static plates will end up at relative close distances. With the help of a shaft 15D, bearings 15E and an external motor 15F the discs can be rotated concurrently 15J. The resistance to move, experienced by the fluid against the surfaces of the discs and static plates, causes the fluid to move and to be pushed out of the device that is completely contained with a casing 15G. The fluid 15L exits the device via an exhaust port 15K and end openings 15H provided on the lateral walls, discs and plates 15H create a passage for fresh fluid 15I to enter the device and to move between the discs and plates.

Figure 16:
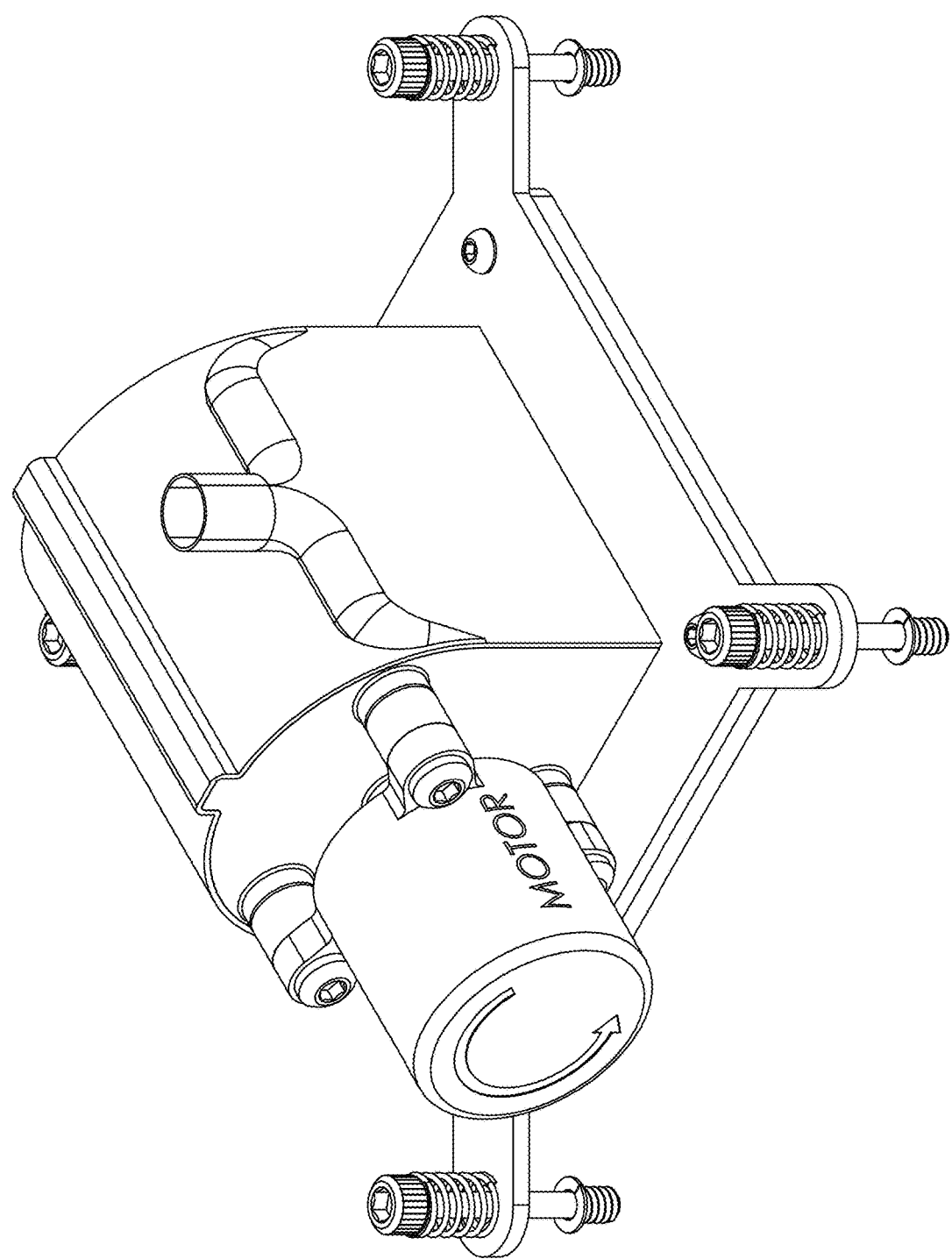
FIG. 16 is a perspective view of a convector designed for cooling electronic components.
Figure 17:
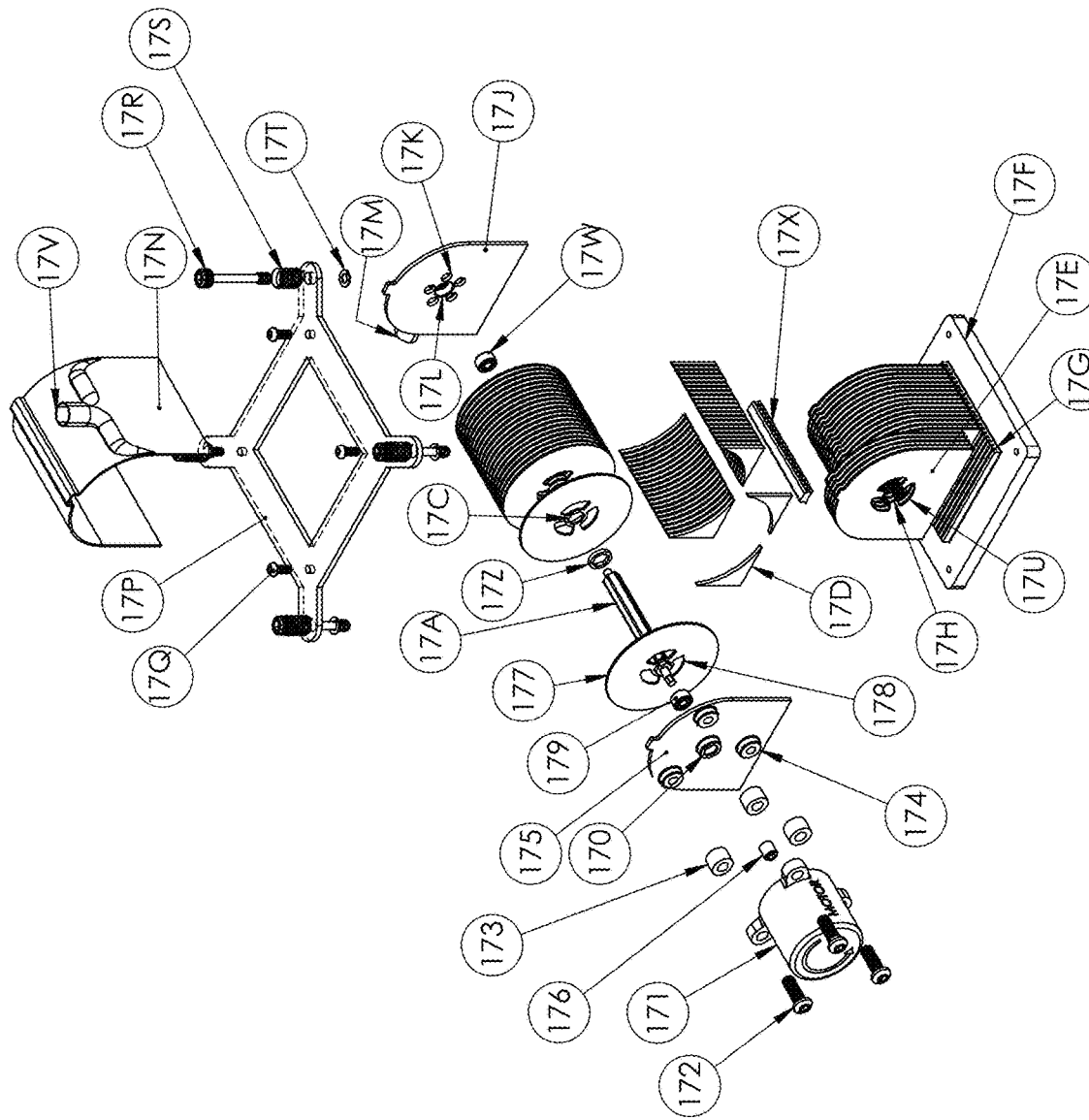
FIG. 17 illustrates an exploded view of the convector shown in FIG. 16.

Convectors can be designed for applications related to the temperature control of high power electronic components such as microprocessors in computers or amplifiers in power sources. A device designed for use with a microprocessor is depicted in FIG. 16, where a mounting mechanism is provided to ease the installation of the device. Just like most convectors, the device (referring to FIG. 17) has a motor 171 that can be attached to a frontal wall 175 on bosses where threaded holes are provided 174. Screws 172 can be utilized to mount the motor against the wall. Spacers 173 and a coupler 175 help align the motor with the shaft of the convector 17A. A bearing 179 is press-fitted into a nesting location 170 on the frontal wall 175. An opening on the nesting location 170, allows the shaft to expose its end to meet with the end of the motor's shaft. A base 17F made from highly conductive metal is populated with flat plates or fins 17E, into equally spaced grooves 17G machined on the top surface of the base. The device shown here is designed with a solid shaft and with a single air pipe 17M located on the back wall 17J. The pipe directs the incoming air to a series of radial openings 17K, located at some distance from the central point where the shaft 17A revolves. Radial air openings 178 are provided also on the discs 177 and fins 17E. The discs 177 are designed to have a central opening 17C were the shaft 17A can slide freely. Fins are also provided with a circular clearance opening 17H intended to allow the shaft to rotate without touching the fin's walls. Because the fins 17E are wide at the point where they get attached to the base, fin separators 17D with a circular shape on the inner wall facing the discs, are added to the assembly. This design includes also a retaining bar 17X to prevent the fins from moving and disc spacers 17Z to keep the discs 177 at the right distance from the fins 17E. A bearing at the back side of the shaft 1W is also press-fitted into a cavity or nest 17L located on the back wall 17J. The base 17F, fin separators 17D, fins 17E, holding mechanism 17P, screws 17Q, captive screws 17R, springs 17S and retainers 17T are pre-assembled before the discs 177 and disc separators 17B get placed in between the fins. Once this operation is completed, the shaft 17A is placed through all of the discs 177 and disc separators 17B and the front wall 175 with bearing 179 attached, is placed over the shaft 17A. In a similar procedure, the back wall 17J with respective bearing 17W is placed over the other end of the shaft. At this point, the retaining bar 17X is placed over the top of the fins 17E and the casing 17N, with a built-in exhaust port 17V, is placed over the complete fin-disc assembly. After the casing and walls are fully secured with fasteners (not shown), the motor 171 is attached to the end of the shaft with the use of a coupler 176. Screws 172 and spacers 173 help attach the motor to the front wall 175 to finish assembling the device.

Figure 18:
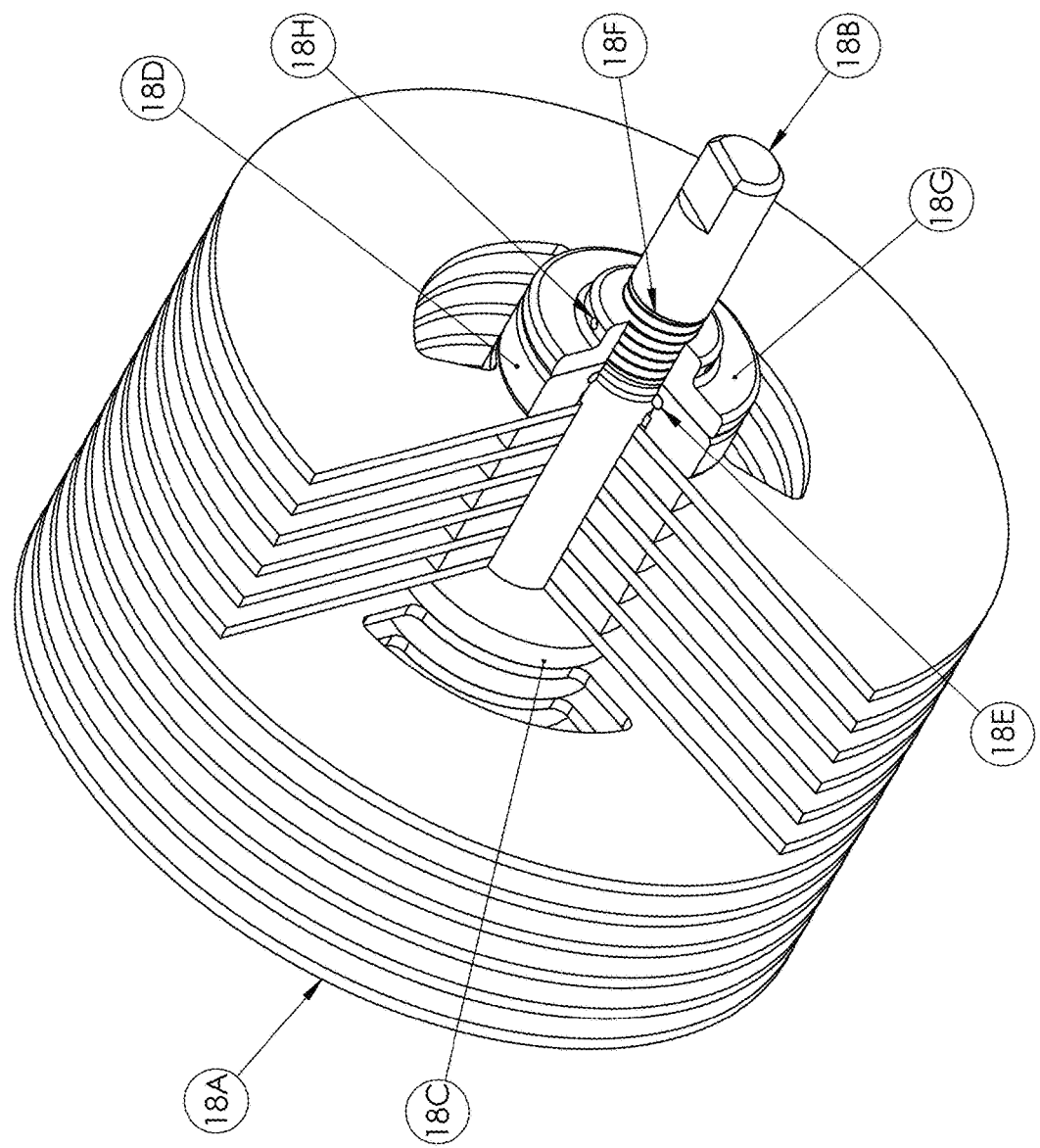
FIG. 18 shows an isometric view of a rotor designed with a compression system.

Some convectors are designed with rotor assemblies that require a compression mechanism; FIG. 18 shows a rotor where a solid shaft 18B is populated with flat, circular, equally thick, equally-spaced discs 18A. The assembly includes disc spacers 18C, end seals 18D with O-rings 18E and a compression structure 18G fitted with set screws 18H. The shaft design 18B includes a threaded section for the compression mechanism 18G and smooth, cylindrical surfaces at both ends to allow the bearings that will be mounted at its ends to rotate with minimum effort. The end of the shaft where the motor gets attached can be provided with a flat section to ease the mounting procedure.

Figure 19:
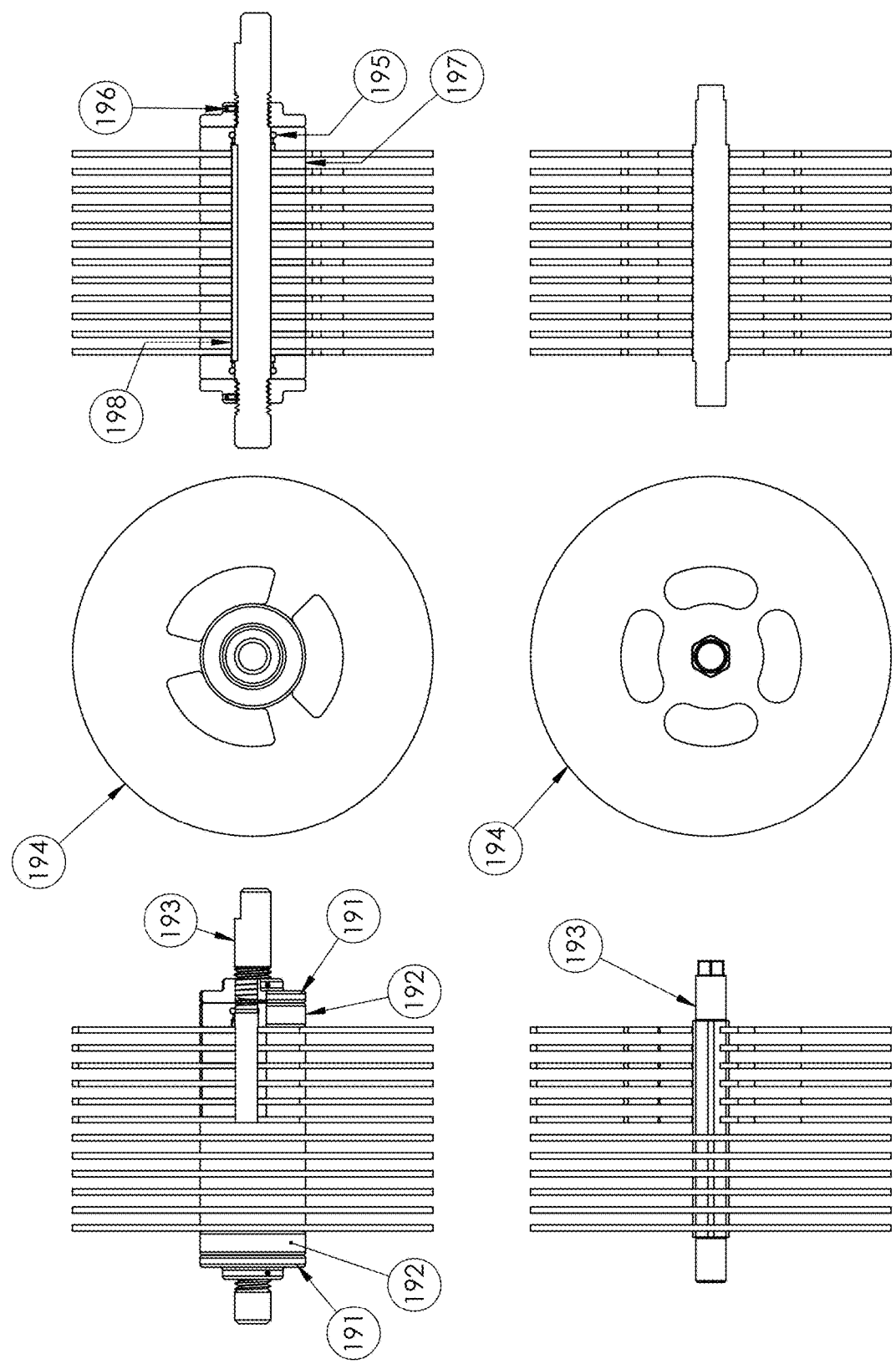
FIG. 19 shows the comparison of a rotor with free floating discs and a rotor with a compression system.

Depending upon the application, convectors can be designed with solid shafts coupled to free-floating discs or with solid shafts where the discs have to have a compression system. FIG. 19 shows two rotor assemblies to show the main differences between these two options. The rotor on the top left is of the kind where a compression mechanism is included 191, along with end-seals 192 and nesting O-rings 195. The compression structures 191 are threaded on the shaft 193 and held securely in place with the help of set screws 196. Disc spacers 197 and keys 198 placed on the shaft 193, secure all of the discs 194 at pre-determined distances. The rotor at the bottom of the drawing exemplifies the free-floating disc type. These rotors are provided with discs 194 where a central opening allows the shaft 193 to slide freely. Because the discs float on the shaft without any impediment, this type of rotor can only be utilized in devices oriented with the edge of the discs perpendicular to the surface the device sits on. Devices with rotors that include a compression system can be utilized in any orientation.

Figure 20:
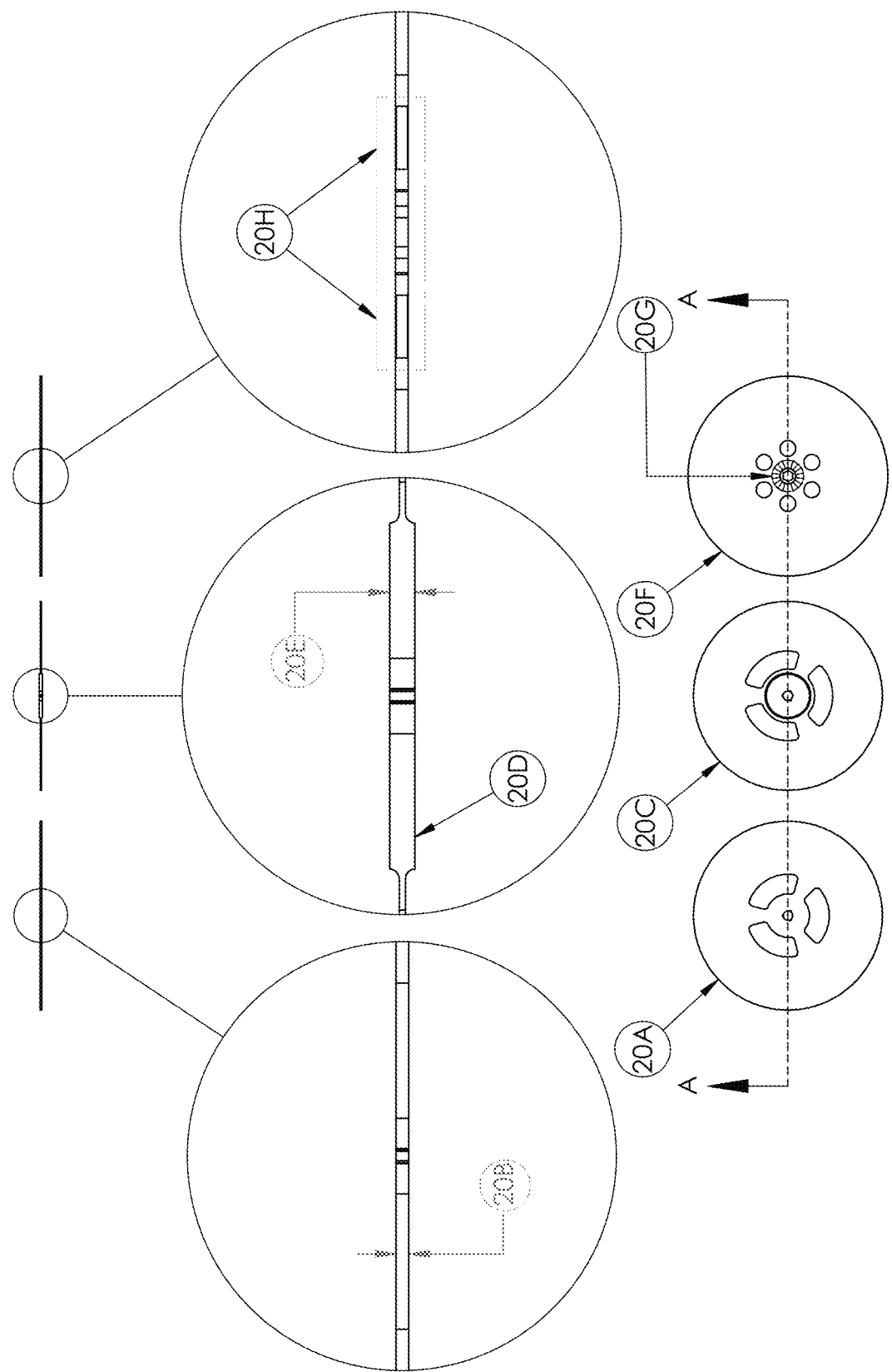
FIG. 20 depicts the frontal, top, and cross-sectional views of various disc design embodiments.

One of the main components of convectors is discs, in fact, many of them. Discs, circular in shape are flat and thin and they are utilized in convectors as part of rotor assemblies and can be manufactured from metals and non-metals alike. Placed between fins, discs (with same diameter and thickness) help in the process of heat exchanging as they rotate creating disturbance in the boundary layer of the stator plates' surfaces. Discs do not have to be completely flat as can be seen in FIG. 20. Circular discs 20A that have flat cross-sections with some specific thickness 20B are the most common design utilized in convectors. Another design approach includes flat discs 20C with a thicker section 20E in the center of the disc. This design removes the need for disc spacers and the thicker section 20D provides better support and a stronger holding mechanism to the shaft. Yet another design on flat discs 20F includes a metal insert 20G placed in the middle of a non-metal disc, the insert could be made thicker than the rest of the disc 20H. Discs with metal inserts are much stronger than any of the other designs shown and if they are properly designed, they can also eliminate the use of separate disc spacers. Of all of the designs, discs with metal inserts are the most complicated and expensive to manufacture.

Figure 21:
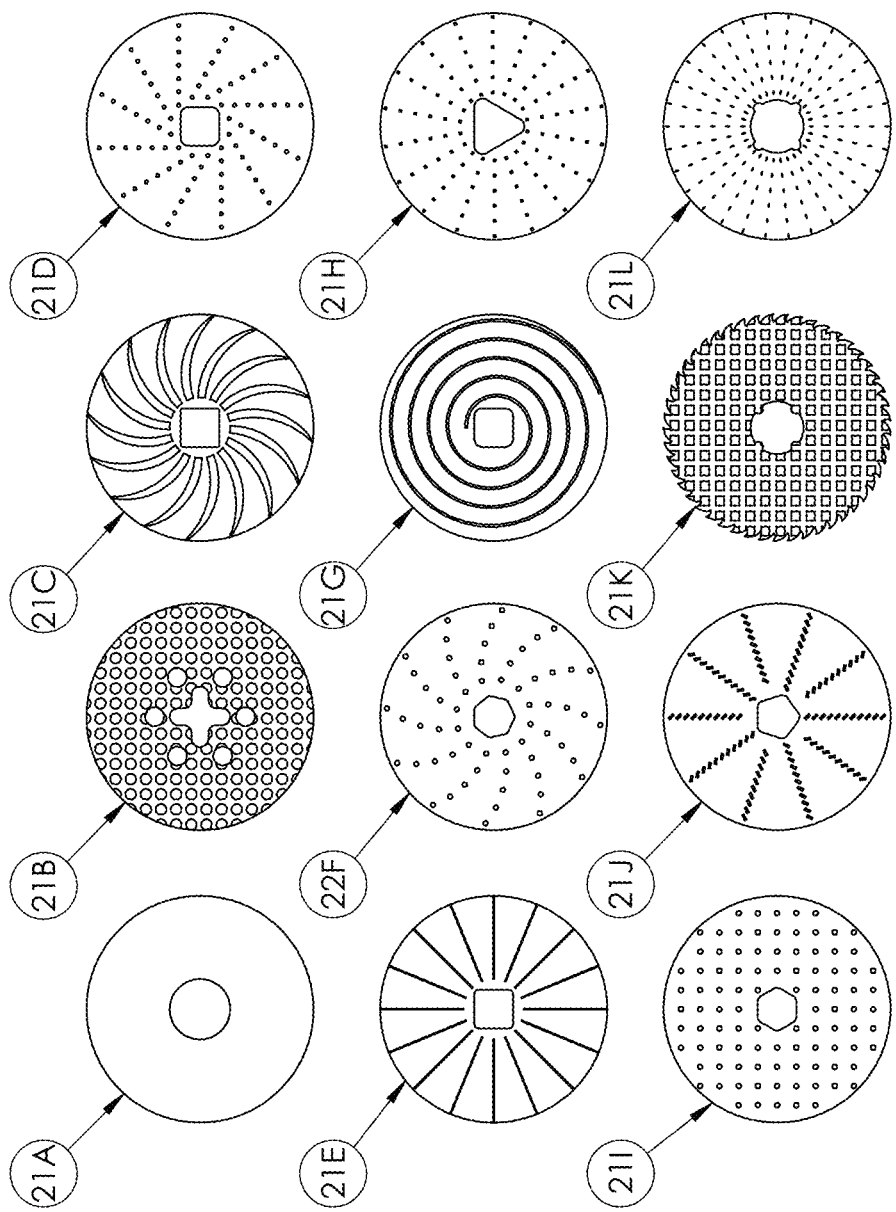
FIG. 21 illustrates several discs with various surface configurations and finishes.

Discs are an integral component of convectors and they could be flat with smooth surfaces or relatively flat with features on both surfaces. FIG. 21 shows a sample of the large variety of designs and surface geometries that discs intended for use in convectors could have. Of all of the designs, the most straight forward and simple is that of a perfectly flat disc with smooth ages and polished surfaces 21A; other designs include discs with surfaces on which certain features (bosses, dimples, indentations, etc.) have been provided across the full face of the disc 21B, 21*i*, 21K; other design variation include specific geometric features such as vanes, grooves, dimples, bosses, indentations or bumps set in radial, circular or spiral configurations 21C, 21D, 21E 21F, 21G, 21H, 21J, 21L; yet another variation includes non-smooth edges 21K. Depending upon of the desired effect expected from the discs, the addition of features to the surfaces of discs help increase their total surface area. In return, the greater surface area help their performance as aids in the heat exchanging process. If discs are utilized with non-compressible fluids, discs may be designed to include radial features to act as vanes and help stir and push the fluid.

Figure 22:
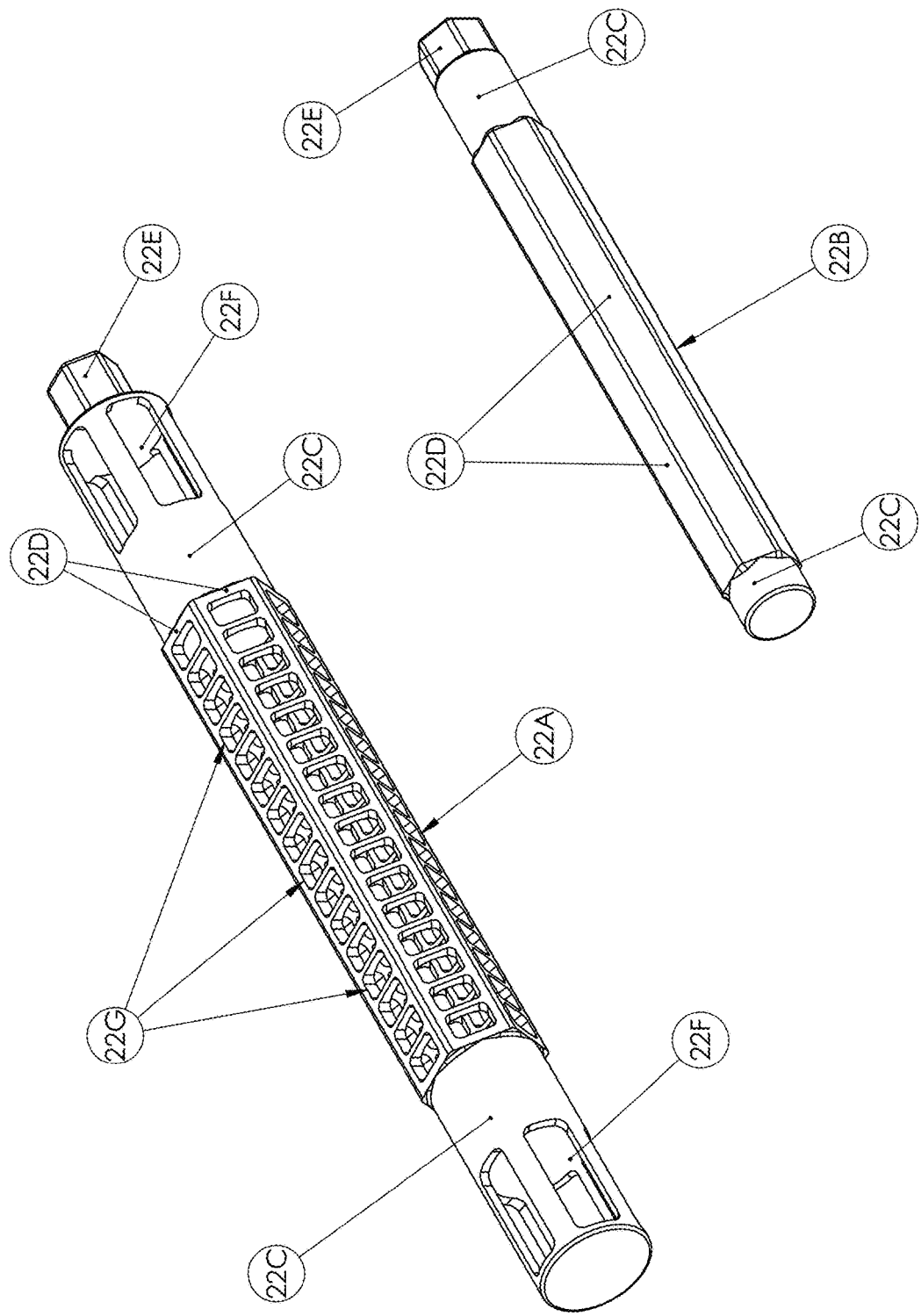
FIG. 22 is a perspective view of a hollow shaft design versus a solid shaft design.

Shafts utilized in convectors can be of the solid-bar type or the hollow-tubular type. FIG. 22 shows both of these types. Shafts made from solid bars 22B are simple and have just a few features. Shafts of the hollow-tubular type 22A are complex and have many more features than the solid-bar type. Regardless of the type, shafts of both types share several features, among these features, shafts have an area intended for bearings to ride on 22C, planar areas to support the discs 22D, and a mechanism to attach them to a rotating device 22E. A hollow tubular type of shaft includes extra features such as air passages located at both ends 22F, and air passages along the full length of the shaft 22G. For obvious reasons, the complexity of hollow-tubular shafts makes them difficult and expensive to manufacture.

Figure 23:
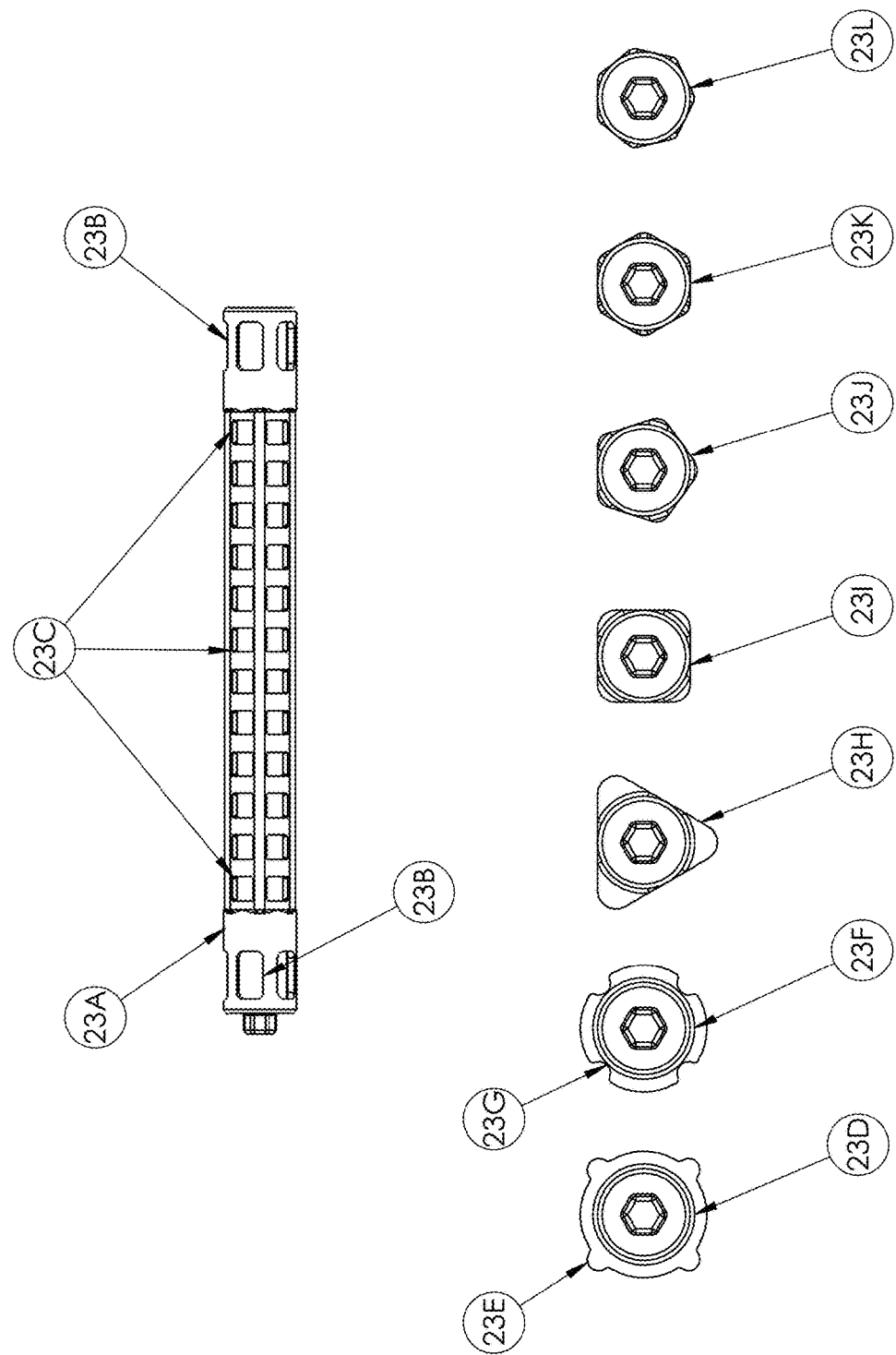
FIG. 23 illustrates a top view of a representative hollow shaft design and various cross-sectional geometries of hollow shaft designs.

Shafts of the hollow-tubular kind (FIG. 23) are designed with some distinct features that include fluid passages at both ends 23B, an area at the both ends to allow a bearing to be mounted 23A and fluid passages along the full length 23C. Shafts of this type have cross-section geometries with features that help discs placed over them to get "locked" or "keyed" in place, so that if the shaft rotates, so do the discs. Some of the cross-section designs include, but are not limited to, round shafts 23D with bumps along the length 23E; round shafts 23F with grooves along the length 23G; shafts with three sides 23H; shafts with four sides 23*i*; shafts with five sides 23J; shafts with six sides 23K and shafts with seven sides 23L.

Figure 24:
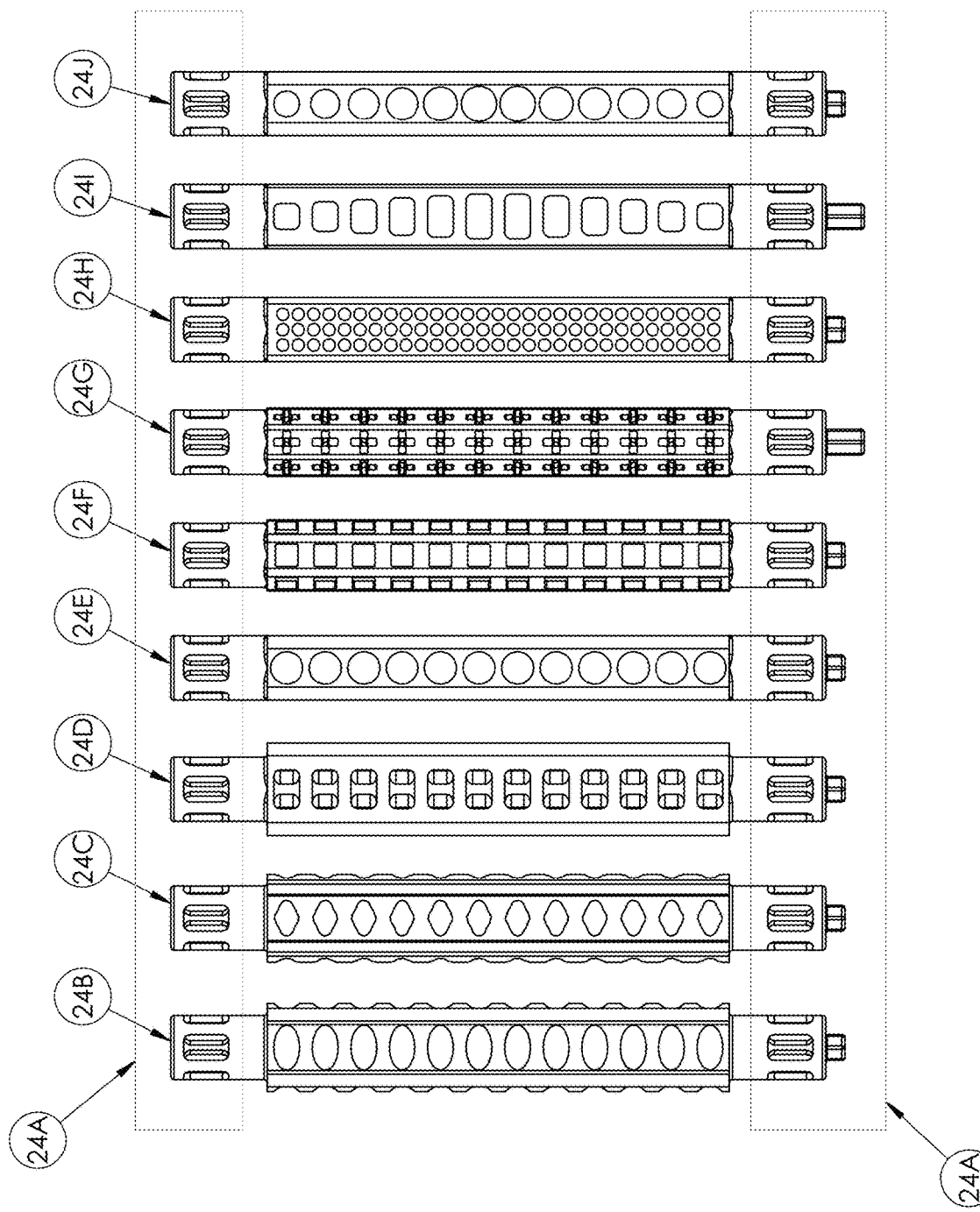
FIG. 24 depicts various air opening designs on hollow shafts.

Hollow-tubular shafts are designed to have, in most cases, fluid openings at both ends and a series of fluid openings along its length to help distribute the fluid that enters the ends. FIG. 24 shows a top view of a sample that includes fluid openings at both ends 24A and a variety of shapes for the openings along the length. It should be understood, that the geometries and shapes presented, constitute only a glimpse of a large number of possible geometries and shapes. The fluid openings can be oval-shaped 24B, diamond-shaped 24C, rectangular-shaped 24D, round-shaped 24E, square-shaped 24F, cross-shaped 24G, consist of a large number of small round holes 24H or have a variable set of rectangular 24*i* or round openings 24J. In any case, the openings have to be placed at regular intervals along the length of the shaft and most be designed so that the shaft remains strong and capable for operation at high speeds and to help distribute the fluid between the discs that make up the rotor and the fins or plates that make up the stator. Shafts of this type can be manufactured with metals and non-metals, but the need for strength and durability makes the choice for metals a given.

Figure 25:
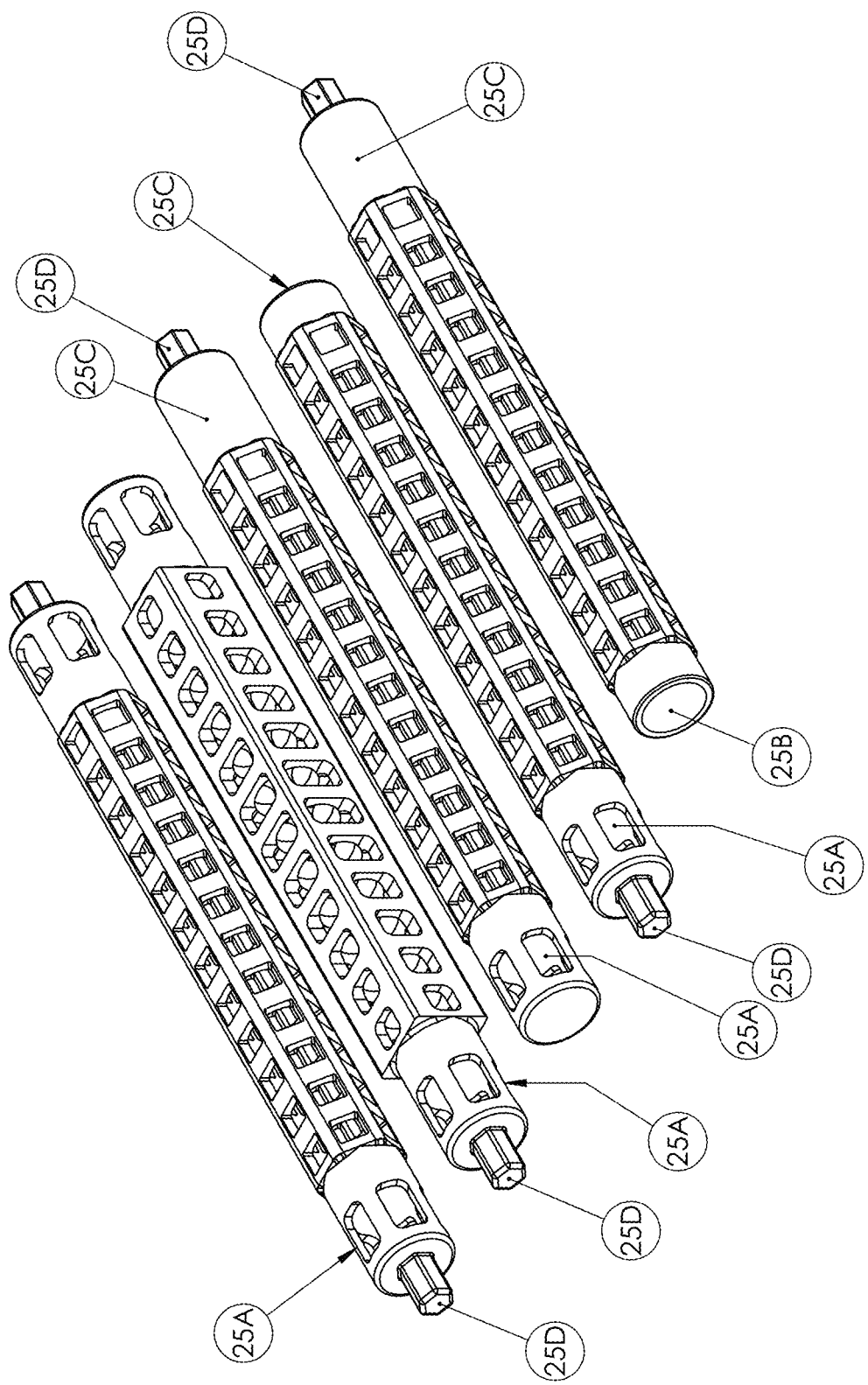
FIG. 25 is a perspective view of various hollow shafts presenting variations related to the number of main air passages and shaft ends.

Hollow-tubular shafts are always provided with, at minimum, a single, main-fluid intake (or a set of smaller openings) at one of its ends and at most, two points of attachment for a rotating device (one at each end of the shaft). FIG. 25 shows the various options available, including shafts with two attachment features to a rotating device 25D or a single attachment feature to a rotating device 25D. All shafts are provided with main fluid openings at either one or both ends of it. The feature that allows fluid enter the device may consist of a single opening or a series of smaller openings designed at one or both ends of the shaft 25A, 25B and all shafts must include a smooth area at both ends to place and hold a bearing there 25C.

Figure 12:
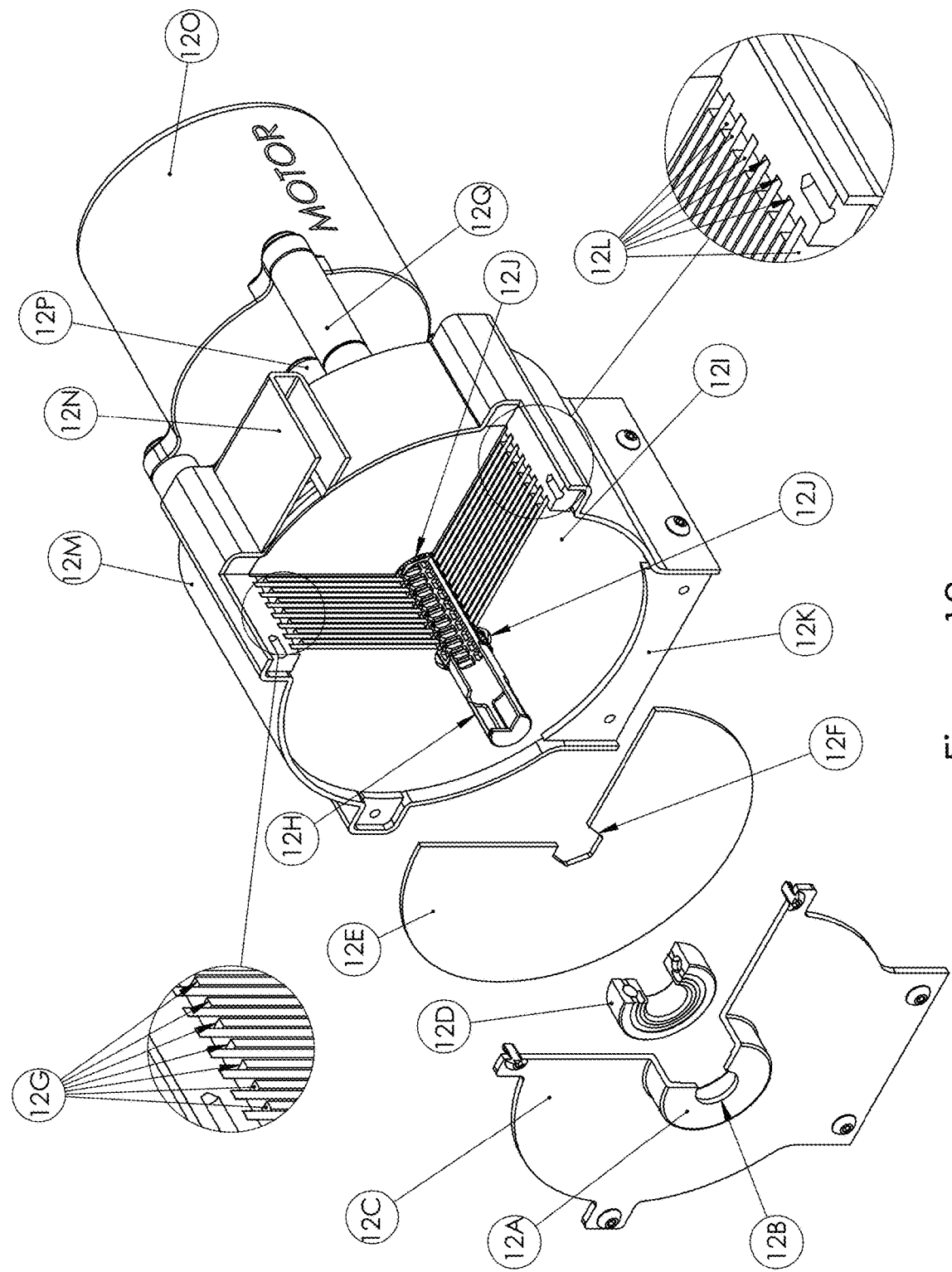
FIG. 12 show some characteristic components of a convector embodiment shown in FIG. 11.
Figure 26:
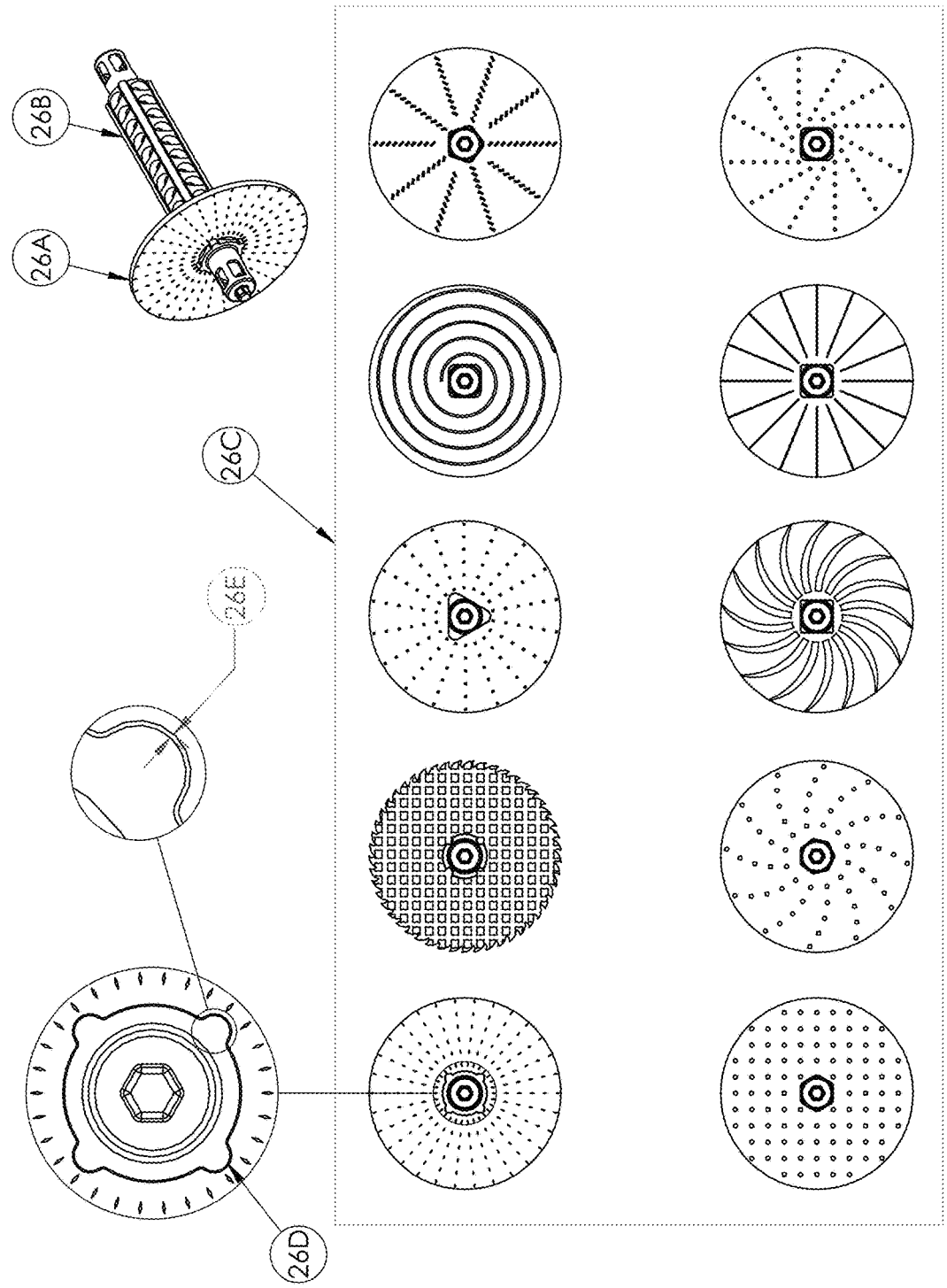
FIG. 26 illustrates the top view of several discs and hollow shafts, a perspective view of a single disc placed onto a hollow shaft and a close up view for clarification of the design.

As it has been indicated in FIGS. 12, 13 and 14, there are various approaches and rotor assemblies that depend upon of the mechanism that holds the discs in place. The most simple of these mechanisms require that the discs be designed with central openings matching the perimeter and shape of the shaft that ultimately will hold them. FIG. 26 shows for ease of understanding, a single disc 26A placed over a hollow shaft 26B. There are many variations that the shaft may have, as far as its cross section is concerned. From the sample presented 26C, the first item on the top row, first column has been selected to show a close view of the shaft-disc relationship 26D. It can be observed, that for the cylindrical shaft with four-lobes, that the central opening on the disc is slightly greater by some dimension 26E. Regardless of the shape and number of sides that the shaft may have, the central opening on the discs, must allow the easy installment of the shaft.

Because fluids have the natural tendency to look for the path of least resistance when placed in a condition where flow is compromised, hollow shafts with regularly spaced fluid passages may not work as expected. That is, fluid may not flow at the same rate at every point along the length of the shaft. In situations like this, the fluid may come at faster or slower rates at different points between the rotating discs and the static plates. This behavior will cause heat transfers to be different at every point with a different flow rate affecting the overall efficiency and performance of the device. Referring to FIG. 27, to avoid this behavior, shafts with single intake ports 27A can be designed to have regularly spaced openings with variable open area. The openings closer to the main fluid entry port should be designed to have a small open area and the area should be increased as the axial location of the openings is increased too. If the shaft is provided with dual fluid entry points, the same approach utilized on single fluid entry point should be used, the resulting effect is that of small open area passages near the entry ports and large openings in the middle of the shaft 27B, 27C. If turbulent flow is required, a special shaft 27D with tangential ports 27F to the inner diameter 27E can be designed. Of course, the designs previously discussed represent only a few of many designs that can help control the flow rates of fluid entering the device through the shaft.

As it has been pointed before, convectors, or should it be said, rotors for convectors can be designed with either hollow shafts and/or solid shafts. FIG. 28 shows a sample of possible, but not limited to, configurations and geometries for several solid shafts. Solid shafts are components designed to perform various tasks including holding several discs, provide rotational motion to the discs and locking or keying the discs so that they can be rotated simultaneously. Some three-dimensional designs (and their cross sections) include round shafts with lobes 28A, round shafts with grooves 28B, three sided shafts 28C, square shafts 28D, five sided shafts 28E and hexagonal shafts 28F. Solid shafts have several advantages over other shaft designs. Some of these advantages include design simplicity, small size, small weight and small cost. Solid shafts should be considered the first choice over any other choice when designing convectors.

FIG. 29 shows a conceptual three-dimensional model of a group of fluid-cooled convectors 29C, driven by a single motor 29F. Connected in series with the help of flexible couplers 29E, the convectors 29C, provide cooling to a group of microprocessors 29B that are mounted to a PC board 29A and held under some even pressure against the convectors with the help of some retaining mechanism 29D. As the rotors within the convectors spin with help from the external motor 29F, they draw fresh fluid 29G from the outside, through a lateral intake 29H. After the fluid has picked up the heat from the internal plates, heat and air 29$i$ get expelled through an exhaust port 29J. An advantage of this kind of set up is that the exhaust from all the individual convectors can be directed to a single exhaust pipe, and the pipe can be directed to an area away from the processors to avoid exhaust recirculation. Other advantages of this type of system is that it eliminates or reduces the use of fans, eliminates or reduces the noise levels, they are compact, and because they are efficient, they reduce the amount of power needed to operate them and the convectors can utilize compressive or non-compressive fluids.

Although FIG. 30 provides a sample of designs possible for bases utilized in convectors, this does not limit other designs not included here, but in general, all bases are made of highly thermal conductive materials, have multiple channels for attachment of plates or fins that are usually brazed, bonded or mechanically held in place, and because bases are intended to transfer heat from a component or a device placed against them, they have their bottom surfaces to be machined and polished to very small tolerances (±0.0005 inches [~13 micrometers]) to improve heat transfer. Bases can be utilized in conjunction with heat pipes and vapor chambers in order to provide better and efficient heat transfer capabilities.

Flat plates or fins for convectors come in many shapes, configurations and sizes, FIG. 31 presents, but does not limit, designs of several fin or stator plates where plates with multiple, radial openings near the center are plates utilized on convectors build around a solid shaft. Discs with a single, circular opening are utilized along hollow-tubular shafts.

Fins or stator plates do not have to be flat components. They can also have features to help contain the fluid as it spins between their surfaces or to strengthen the overall assembly. FIG. 32 presents, but does not limit, designs of several fins or stator plats build with several features such as a central clearance opening 32A, and flat indented areas 32B and bosses 32C to help contain and delimit the rotating discs. Depending upon the design, this type of design can practically eliminate the need of a casing for some convectors.

FIG. 33 presents a device built with three dimensional stator plates 33A. As stated several times before, the purpose of fin separators is to create a cylindrical cavity for the spinning discs. The cavity helps create a chamber 33B that gives all fluid propulsing devices, such as convectors, the ability to behave as pumps or as blowers with exhaust ports tangential to the outer diameter of their chambers 33C. As it is shown in the exploded view of the device FIG. 34, the front cover 34C, the back cover 34D and all of the fins 34A that conform the stator 34B have features like bosses and indentations that prevent the use of fin spacers. The back cover 34D clearly shows the scroll shape of the inner chamber of the device.

Convectors are by design, fluid propulsors like pumps and blowers. Their performance as such depends on a technical characteristic that must be present in every design: the scroll-shape ($\sigma$) of the chamber where the discs rotate. FIG. 35 shows various convectors each of which has an external feature that makes the design different from the rest. For example, convector 35A has a straight plume exhaust, convector 35B has a flared plume exhaust, convector 35C has a narrow, plume-less exhaust, convector 35D has a narrow plume exhaust and convector 35E has no casing, exposing a multiple set of plume-less exhaust openings. The cross-sections of convectors 35A and 35B are shown in FIG. 36 to demonstrate the common denominator between these two convectors. So, while the convector on the left side of the drawing has a straight plume exhaust 36D, the convector on the right has a flared plume exhaust, but all of the remaining characteristics are in both devices, exactly the same. These characteristics include: a chamber design 36A that wraps the disc early in its development and slowly increases in diameter; this design characteristic is purposely added to devices whenever the movement of large fluid volume is required; devices with this feature are referred as volume convectors; as a result, convectors 35A and 35B fall under this category; b) inclusion of fin separators or built-in structures to act as fin separators 36C; and c) disc diameter 36B is the same for both devices.

The cross-sectional views of three convectors shown in FIG. 35 labeled 35C, 35D and 35E are shown in FIG. 37 to demonstrate the common denominator between these convectors. So, while the convector on the left side of the drawing has a straight and narrow plume-less exhaust 37D, the convector in the middle has a straight, narrow plume exhaust and the convector on the right side of the drawing has a narrow, plume-less exhaust on a device that has no casing.

But, regardless of the differences described, the remaining characteristics in all of the devices are exactly the same. These characteristics include: 1) a chamber design 37A that wraps the disc completely, but with a narrow gap between the edge of the discs and the inner diameter of the chamber 37C; this design characteristic is purposely added to devices whenever the amount of pressure needed from the device is large; devices with this feature are referred as pressure convectors; convectors; as a result, convector 35C, 35D and 35E fall under this category; b) inclusion of fin separators or built-in structures to act as fin separators 37B; and c) disc diameter 37A is the same for all of the devices.

What I claim is:

1. A microprocessor cooling system for cooling an array of microprocessors mounted to a CPU board of a computing device, the microprocessor cooling system comprising:
    at least one lateral intake for drawing in a fluid;
    an array of mechanically coupled convectors corresponding to the array of microprocessors, the array of convectors mounted to the CPU board with each convector mounted above a respective microprocessor, each convector comprising:
        a volute-shaped housing having a radially outer casing defining a single exit port for guiding a respective portion of the fluid drawn in by the at least one lateral intake out of the housing;
        a stator having a plurality of plates operatively disposed inside the radially outer casing of the housing and configured to conduct heat; and
        a rotor having a shaft and plurality of disks, the shaft extending longitudinally along an axis of rotation from a front end of the housing to a rear end of the housing, each of the plurality of disks disposed inside the radially outer casing, adjacent at least a respective one of the plurality of plates, and rotatable with the shaft about the axis of rotation, wherein the housing completely encapsulates the stator and the rotor, wherein the housing, the stator, and the rotor together define a spiral flow path for guiding the respective portion of the fluid through the volute-shaped housing, in both radially outward and longitudinal directions, to the single exit port, wherein each exit port of each convector is fluidly coupled to a single exhaust pipe configured to direct the respective portion of fluid flowing out of each respective exit port of each convector to an area away from the array of convectors, the CPU board, and the at least one lateral intake to cool the array of microprocessors and avoid recirculation of the fluid flowing out of the exit ports.

2. The convector system of claim 1, wherein each convector is mounted above a respective microprocessor via a retaining mechanism such that the convectors are thermally coupled to but do not directly touch the microprocessors.

3. The convector system of claim 2, wherein the array of convectors are linearly arranged in series.

4. The convector system of claim 1, wherein the shafts of the array of convectors are part of a single integrally formed shaft.

5. The convector system of claim 1, further comprising:
a single motor mechanically coupled to each shaft of each convector, wherein the motor is configured to rotate each shaft and each plurality of plates of each stator of each convector to drive respective fluid therethrough.

6. The convector system of claim 2, wherein the array of convectors define a footprint on the CPU board which is approximately equal to a footprint of the array of microprocessors on the CPU board.

* * * * *